(12) United States Patent
Inokuchi et al.

(10) Patent No.: US 8,217,438 B2
(45) Date of Patent: Jul. 10, 2012

(54) SPIN MEMORY AND SPIN FET

(75) Inventors: Tomoaki Inokuchi, Kawasaki (JP);
Yoshiaki Saito, Kawasaki (JP);
Hideyuki Sugiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 12/851,072

(22) Filed: Aug. 5, 2010

(65) Prior Publication Data
US 2011/0108898 A1    May 12, 2011

Related U.S. Application Data

(63) Continuation of application No. 11/846,040, filed on Aug. 28, 2007, now Pat. No. 7,812,383.

(30) Foreign Application Priority Data

Sep. 8, 2006    (JP) .................................. 2006-244881

(51) Int. Cl.
*H01L 29/82* (2006.01)
(52) U.S. Cl. ................. 257/295; 257/E29.323
(58) Field of Classification Search .................. 257/295, 257/E29.323
See application file for complete search history.

(56) References Cited

U.S. PATENT DOCUMENTS

| | | | |
|---|---|---|---|
| 6,066,867 A * | 5/2000 | Nakamura | 257/295 |
| 6,256,223 B1 | 7/2001 | Sun | |
| 6,611,405 B1 | 8/2003 | Inomata et al. | |
| 6,709,942 B2 | 3/2004 | Pan et al. | |
| 6,751,074 B2 | 6/2004 | Inomata et al. | |
| 6,777,730 B2 | 8/2004 | Daughton et al. | |
| 6,987,653 B2 | 1/2006 | Inomata et al. | |
| 7,038,894 B2 | 5/2006 | Inomata et al. | |
| 7,193,891 B2 * | 3/2007 | Johnson | 365/158 |
| 7,342,244 B2 * | 3/2008 | Kaushal et al. | 257/24 |

(Continued)

FOREIGN PATENT DOCUMENTS

CN    1368735 A    9/2002

(Continued)

OTHER PUBLICATIONS

Yiming Huai, et al., "Observation of spin-transfer switching in deep submicron-sized and low-resistance magnetic tunnel junctions", Applied Physics Letters, vol. 84, No. 16, Apr. 19, 2004, pp. 3118-3120.

(Continued)

*Primary Examiner* — Allan R Wilson
(74) *Attorney, Agent, or Firm* — Oblon, Spivak, McClelland, Maier & Neustadt, L.L.P.

(57) ABSTRACT

A spin memory includes a magneto-resistance element having a first ferromagnetic layer in which a magnetization direction is pinned, a second ferromagnetic layer in which a magnetization direction changes, and a first nonmagnetic layer between the first and second ferromagnetic layers, a lower electrode and an upper electrode extending in a direction between 45 degrees and 90 degrees relative to an axis of hard magnetization of the second ferromagnetic layer, and sandwiching the magneto-resistance element at one end in a longitudinal direction, a switching element connected to another end in a longitudinal direction of the lower electrode, and a bit line connected to another end in a longitudinal direction of the upper electrode, wherein writing is carried out by supplying spin-polarized electrons to the second ferromagnetic layer and applying a magnetic field from the lower electrode and the upper electrode to the second ferromagnetic layer.

10 Claims, 18 Drawing Sheets

U.S. PATENT DOCUMENTS

| | | | |
|---|---|---|---|
| 7,345,852 B2 | 3/2008 | Inomata et al. | |
| 7,394,684 B2 | 7/2008 | Inokuchi et al. | |
| 7,453,084 B2* | 11/2008 | Nowak et al. | 257/30 |
| 7,508,699 B2 | 3/2009 | Hwang et al. | |
| 7,649,767 B2 | 1/2010 | Inokuchi et al. | |
| 7,652,913 B2 | 1/2010 | Sugiyama et al. | |
| 2002/0145902 A1 | 10/2002 | Kunikiyo et al. | |
| 2004/0218443 A1* | 11/2004 | Johnson | 365/202 |
| 2005/0040433 A1 | 2/2005 | Nozieres et al. | |
| 2005/0219768 A1 | 10/2005 | Nakamura et al. | |
| 2005/0282379 A1 | 12/2005 | Saito et al. | |
| 2006/0138502 A1* | 6/2006 | Sugahara et al. | 257/295 |
| 2006/0139992 A1 | 6/2006 | Hwang et al. | |
| 2007/0085068 A1 | 4/2007 | Apalkov et al. | |
| 2007/0253120 A1 | 11/2007 | Saito et al. | |
| 2008/0017843 A1* | 1/2008 | Kaushal et al. | 257/14 |
| 2008/0169492 A1* | 7/2008 | Koo et al. | 257/295 |
| 2009/0236646 A1* | 9/2009 | Sugahara et al. | 257/295 |
| 2009/0278182 A1* | 11/2009 | Xie | 257/295 |
| 2010/0195381 A1* | 8/2010 | Karg et al. | 365/171 |
| 2011/0042720 A1* | 2/2011 | Jalil et al. | 257/194 |

FOREIGN PATENT DOCUMENTS

| | | |
|---|---|---|
| CN | 1556998 A | 12/2004 |
| CN | 1713400 A | 12/2005 |
| JP | 9-50692 | 2/1997 |
| JP | 2005-50907 | 2/2005 |
| JP | 2006-32915 | 2/2006 |
| JP | 2006-156844 | 6/2006 |
| JP | 2006-165556 | 6/2006 |
| JP | 2006-179524 | 7/2006 |
| KR | 2003-0062280 | 7/2003 |

OTHER PUBLICATIONS

T. Inokuchi, et al. "Current-induced magnetization switching under magnetic field applied along the hard axis in MgO-based magnetic tunnel junctions", Applied Physics Letters, 89, 102502 (2006), pp. 102502-1-102502-3.

Master Thesis of Yonsei University (title: Voltage Difference Amplifying Circuit for Improving Sensing Performance of MRAM), Dec. 2005, 19 pages.

Master Thesis of Yonsei University (title: Study of Low-Voltage High-Speed Circuit for Sensing of MRAM Cell), Jun. 2005, 15 pages.

Y. Asao, et al., "Design Process Integration for High-Density, High-Speed, and Low-Power $6F^2$, Cross Point MRAM Cell", IEEE 2004, IEDM Technical Digest, Dec. 2004, pp. 571-574.

T. Inokuchi, et al., "Effect of Magnetic Field Applied Along Hard Axis On Current-Induced Magnetization Switching in CoFeB/MgO/CoFeB Magnetic Tunnel Junctions", Journal of the Magnetics Society of Japan, vol. 31, No. 2, 2007, pp. 98-102.

* cited by examiner

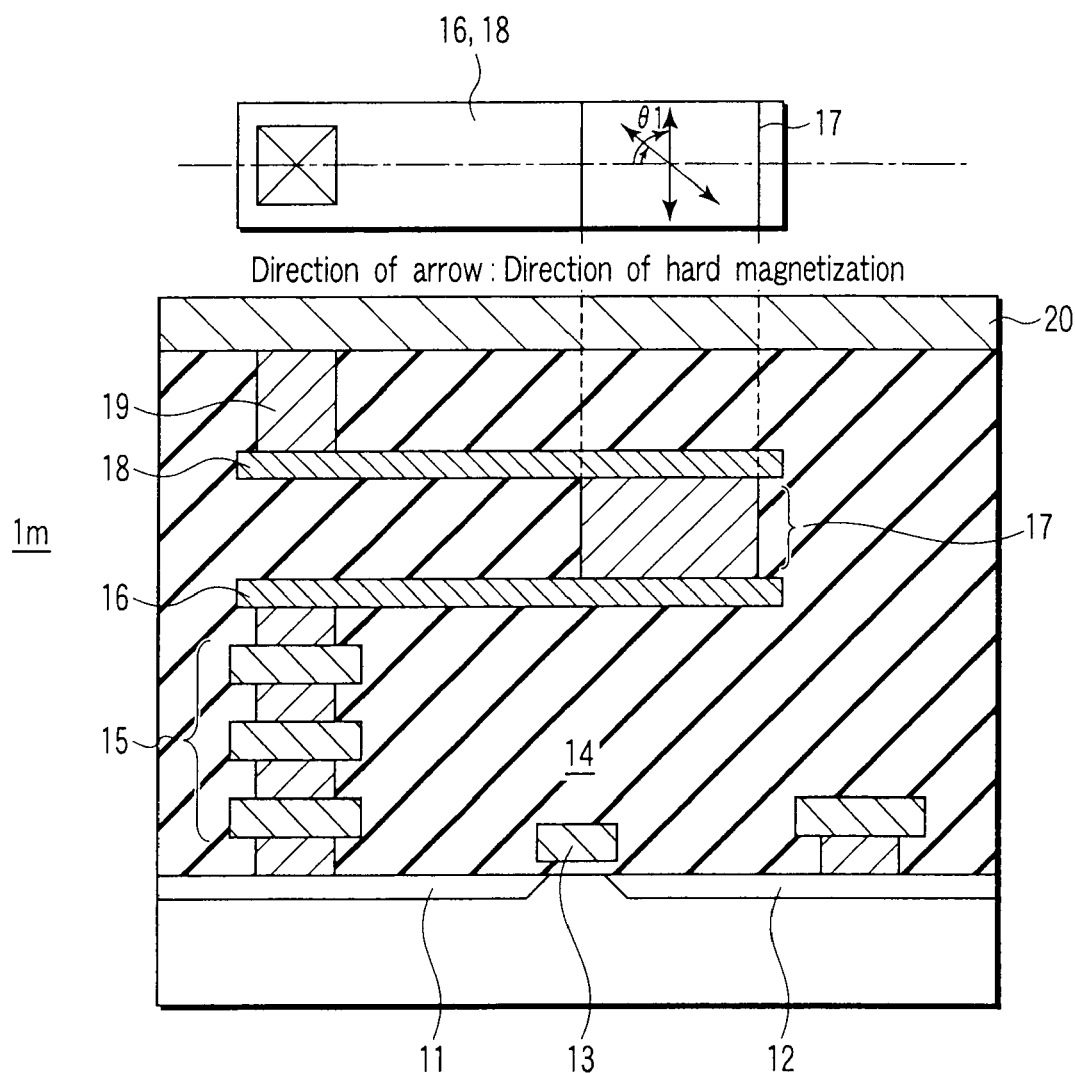
F I G. 1

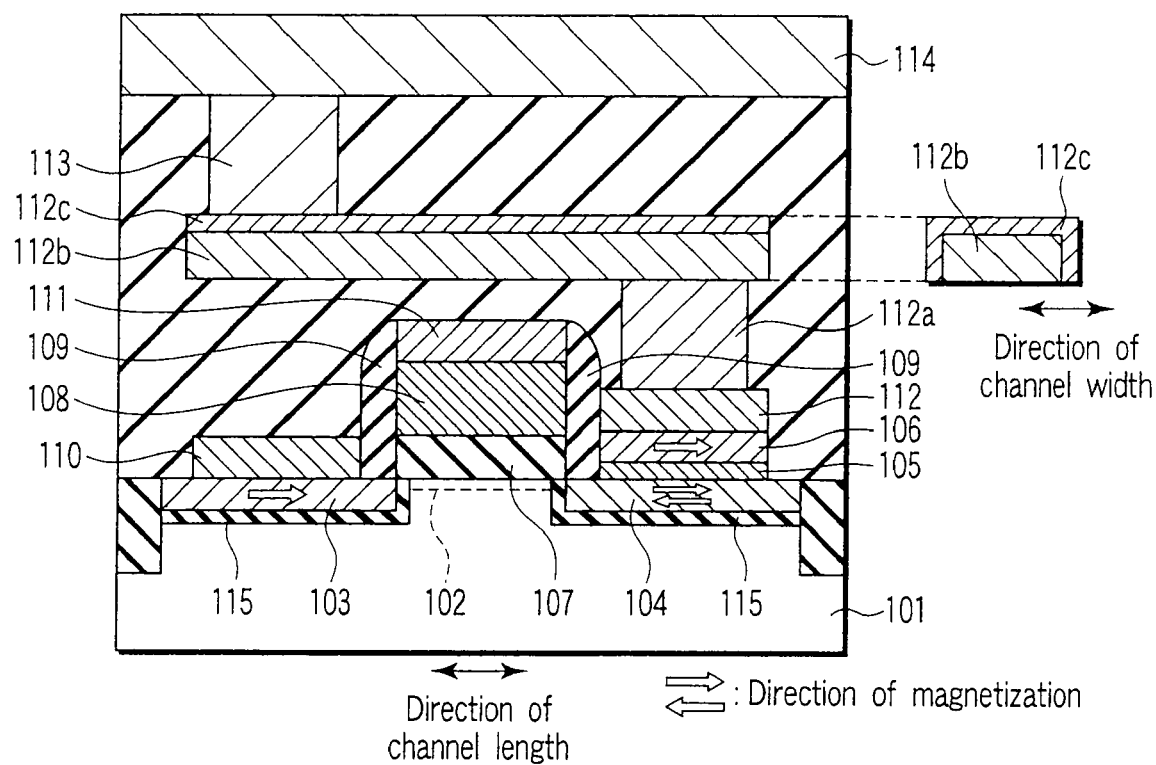
F I G. 10

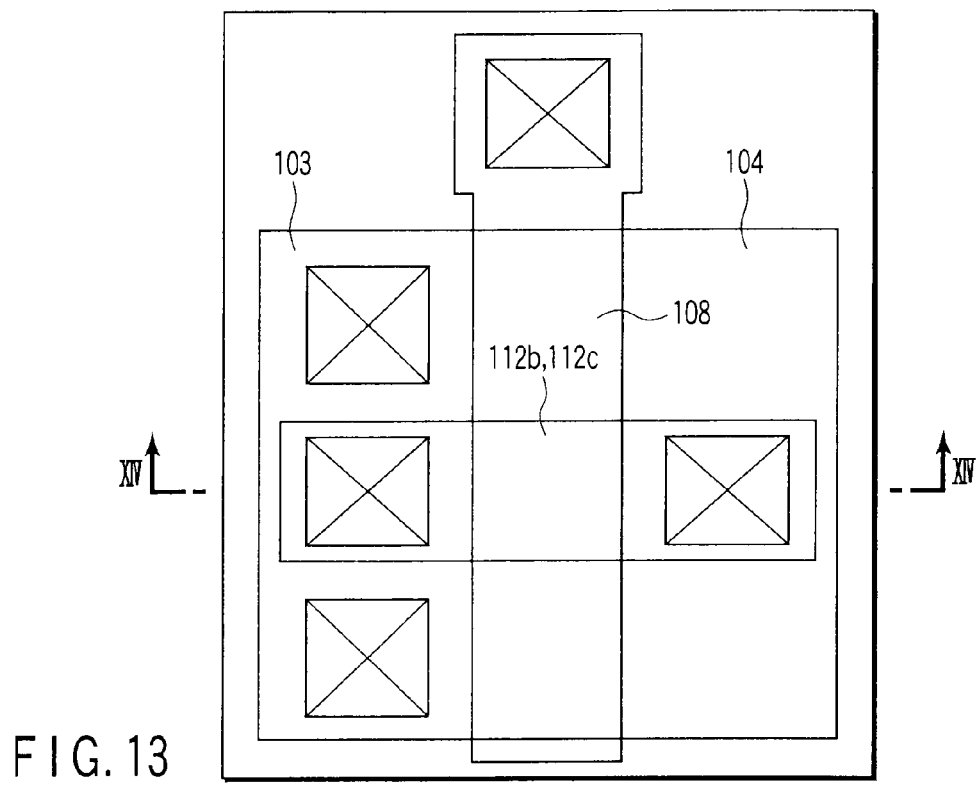
FIG. 13
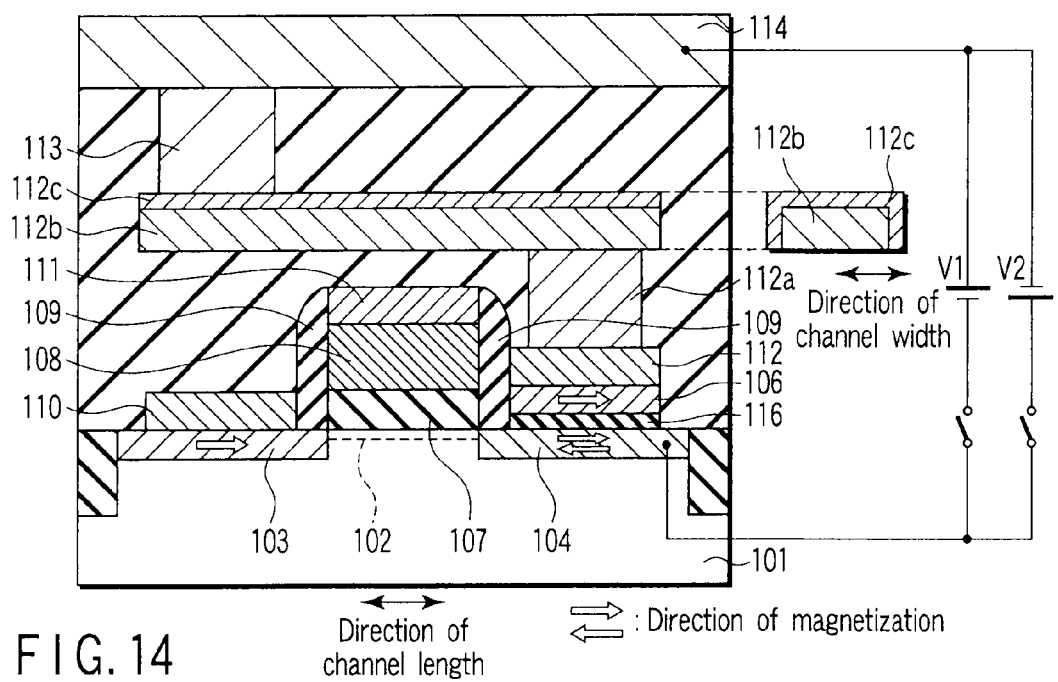
FIG. 14  Direction of channel length  ⇌ : Direction of magnetization

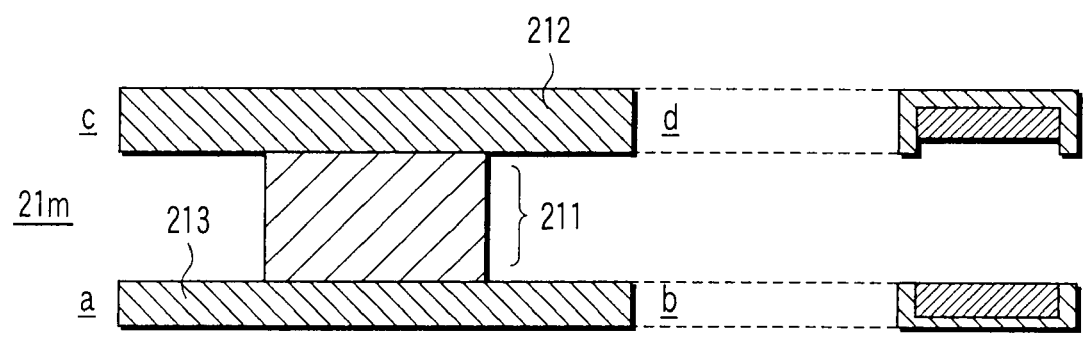
F I G. 15
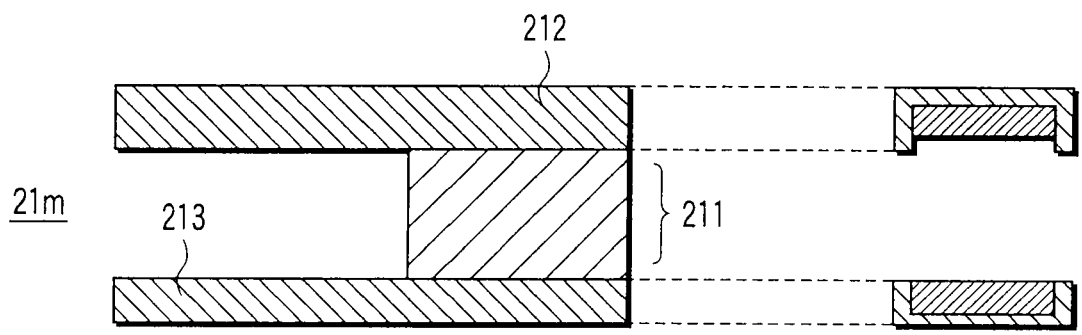
F I G. 16

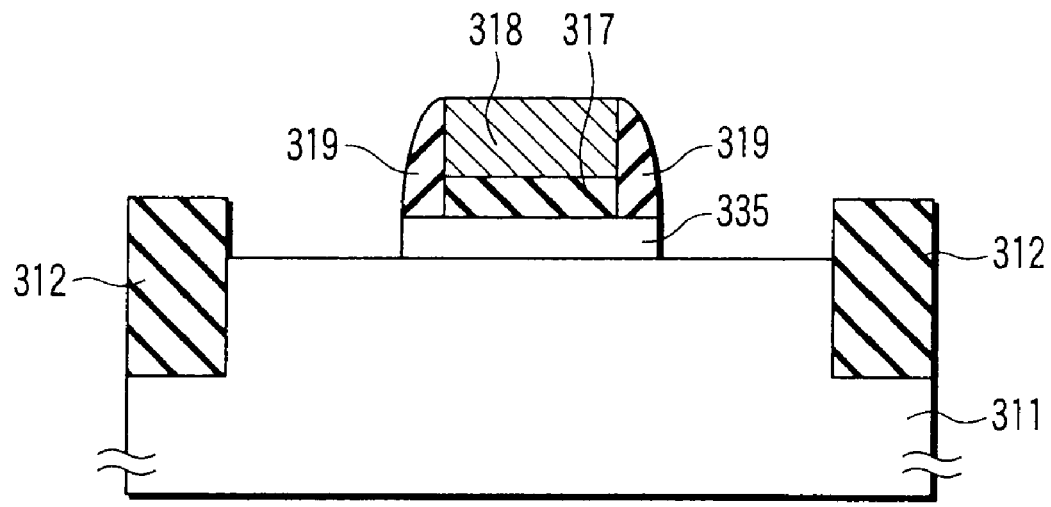
F I G. 19
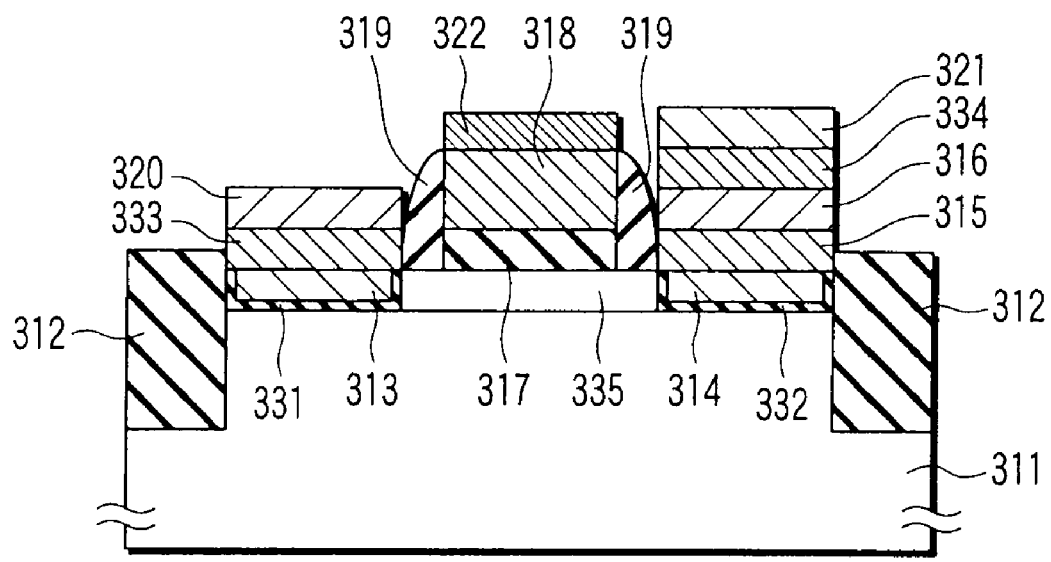
F I G. 20

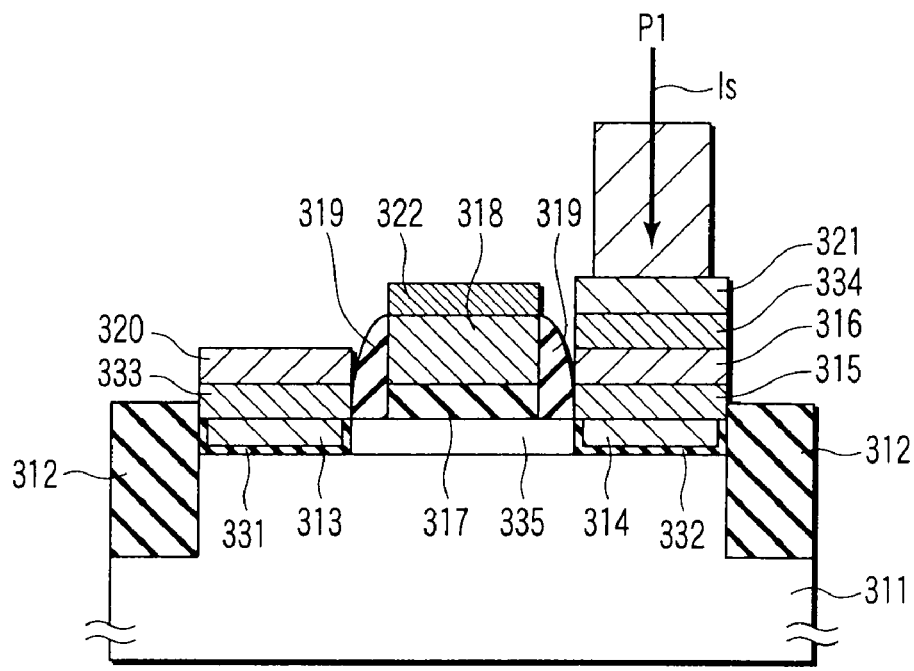
F I G. 21
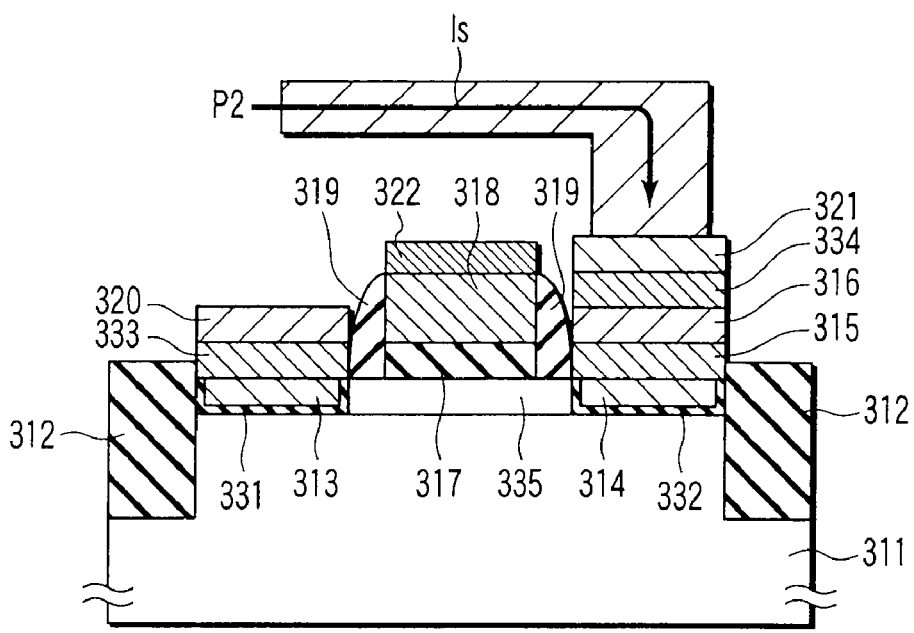
F I G. 22

SPIN MEMORY AND SPIN FET

CROSS-REFERENCE TO RELATED APPLICATIONS

This application is a continuation of U.S. application Ser. No. 11/846,040 filed Aug. 28, 2007, and is based upon and claims the benefit of priority from prior Japanese Patent Application No. 2006-244881, filed Sep. 8, 2006, the entire contents of each of which are incorporated herein by reference.

BACKGROUND OF THE INVENTION

1. Field of the Invention

The present invention relates to a spin memory and a spin FET (field effect transistor) that use a magneto-resistance element.

2. Description of the Related Art

In recent years, an attempt has been actively made to apply a magneto-resistance element to an MRAM (Magnetic Random Access Memory).

Lately, a magneto resistance change rate of 230% or more can be obtained and a decrease in magneto resistance change rate when an applied voltage is increased can be restricted, and thus, applicability to the MRAM has been enhanced. In the case where a TMR (Tunneling Magneto Resistance) element is employed as a memory element of MRAM, one ferromagnetic layer sandwiching a tunnel barrier layer is defined as a magnetic pinned layer, and the other ferromagnetic layer is defined as a magnetic free layer. A memory element using these ferromagnetic single tunneling junction or ferromagnetic double tunneling junction has a potential that a write/read time is as fast as 10 nanoseconds or less in nonvolatile property and the write/erase count is $10^{15}$ or more.

In the case of a magnetic field write system MRAM, at the time of writing into a magnetic free layer, inversion of magnetization of the magnetic free layer is carried out in only a magnetic field due to a current pulse. Therefore, there occur problems that power consumption is larger, when a large capacity is achieved, the allowable current density of wires is limited, making it impossible to achieve a large capacity, and an area of a drive for supplying a current becomes large.

In order to cope with the problems described above, there has been proposed an MRAM provided with a thin film made of a high permeability magnetic material at the periphery of a write line. In the write line provided with a thin film made of this high permeability magnetic material, a magnetic field is efficiently generated, thus making it possible to reduce a current value required for writing information into a magnetic free layer. However, in this case as well, it has been very difficult to restrict a write current to 1 mA or less.

In order to solve these problems, a writing method using a spin injection magnetization inversion technique is proposed (refer to U.S. Pat. No. 6,256,223, for example). In this spin injection magnetization inversion technique, magnetization of a magnetic free layer is inversed by injecting a spin-polarized current into the magnetic free layer of a memory element. A current required for writing decreases due to downsizing of a magnetic free layer, and thus, this technique is expected to be an MRAM writing technique.

However, the current density required for spin injection writing of a conventional TMR element is as high as the order of $8 \times 10^6$ A/cm$^2$, and thus, destruction of a tunnel barrier or large-sized peripheral circuits becomes problematic (refer to Yiming Huai et. al., Appl., Phys. Lett. 84 (2004)3118)). Therefore, it is necessary to reduce a write current in order to achieve stable writing without occurrence of destruction of TMR elements. In addition, this is an indispensable technique because reduction of a write current leads to reduction of power consumption when the technique is applied to an MRAM.

In this manner, in the conventional magneto-resistance element, the current density required for spin injection writing is as high as the order of $8 \times 10^6$ A/cm$^2$, and thus, the destruction of a tunnel barrier and large-sized peripheral circuits become problematic.

BRIEF SUMMARY OF THE INVENTION (1) A spin memory according to an aspect of the present invention comprises a magneto-resistance element having a first ferromagnetic layer in which a magnetization direction is pinned, a second ferromagnetic layer in which a magnetization direction changes, and a first nonmagnetic layer between the first and second ferromagnetic layers, a lower electrode and an upper electrode extending in a direction between 45 degrees and 90 degrees relative to an axis of hard magnetization of the second ferromagnetic layer, and sandwiching the magneto-resistance element at one end in a longitudinal direction, a switching element connected to another end in a longitudinal direction of the lower electrode, and a bit line connected to another end in a longitudinal direction of the upper electrode, wherein writing is carried out by supplying spin-polarized electrons to the second ferromagnetic layer and applying a magnetic field from the lower electrode and the upper electrode to the second ferromagnetic layer.

(2) A spin FET according to an aspect of the present invention comprises a first ferromagnetic layer in which a magnetization direction is pinned, a second ferromagnetic layer in which a magnetization direction changes, a channel between the first and second ferromagnetic layers, a gate electrode formed on the channel via a gate insulation layer, a first conductive line which extends in a direction between 45 degrees and 90 degrees relative to an axis of hard magnetization of the second ferromagnetic layer, and whose one end in a longitudinal direction is connected to one of the first and second ferromagnetic layers, and a second conductive line connected to another end in a longitudinal direction of the first conductive line, wherein writing is carried out by supplying spin-polarized electrons to the second ferromagnetic layer and applying a magnetic field from the first conductive line to the second ferromagnetic layer.

A spin FET according to an example of the present invention comprises a first ferromagnetic layer in which a magnetization direction is pinned, a second ferromagnetic layer in which a magnetization direction changes, a channel between the first and second ferromagnetic layers, a gate electrode formed on the channel via a gate insulation layer, a nonmagnetic layer on the second ferromagnetic layer, a third ferromagnetic layer on the nonmagnetic layer, in which a magnetization direction is pinned, a first conductive line which extends in a direction between 45 degrees and 90 degrees relative to an axis of hard magnetization of the second ferromagnetic layer, and whose one end in a longitudinal direction is connected to one of the first and third ferromagnetic layers, and a second conductive line connected to another end in a longitudinal direction of the first conductive line, wherein writing is carried out by supplying spin-polarized electrons to the second ferromagnetic layer in a path that includes the channel and applying a magnetic field from the first conductive line to the second ferromagnetic layer.

A spin FET according to an example of the present invention comprises a first ferromagnetic layer in which a magnetization direction is pinned, a second ferromagnetic layer in which a magnetization direction changes, a channel between the first and second ferromagnetic layers, a gate electrode formed on the channel via a gate insulation layer, a nonmagnetic layer on the second ferromagnetic layer, a third ferromagnetic layer on the nonmagnetic layer, in which a magnetization direction is pinned, a first conductive line which extends in a direction between 45 degrees and 90 degrees relative to an axis of hard magnetization of the second ferromagnetic layer, and whose one end in a longitudinal direction is connected to the third ferromagnetic layer, and a second conductive line connected to another end in a longitudinal direction of the first conductive line, wherein writing is carried out by supplying spin-polarized electrons to the second ferromagnetic layer in a path that does not include the channel and applying a magnetic field from the first conductive line to the second ferromagnetic layer.

BRIEF DESCRIPTION OF THE SEVERAL VIEWS OF THE DRAWING

FIG. 1 is a sectional view showing a spin memory of a first embodiment;

FIG. 10 is a sectional view showing a modified example of a spin FET of the eighth embodiment;

FIG. 13 is a plan view showing a spin FET of a tenth embodiment;

FIG. 14 is a sectional view taken along the line XIV-XIV of FIG. 13;

FIG. 15 is a sectional view showing a spin memory of a first applied example;

FIG. 16 is a sectional view showing the spin memory of the first applied example;

FIG. 19 is a sectional view showing a spin FET of a second applied example;

FIG. 20 is a sectional view showing the spin FET of the second applied example;

FIG. 21 is a sectional view showing the spin FET of the second applied example;

FIG. 22 is a sectional view showing the spin FET of the second applied example;

DETAILED DESCRIPTION OF THE INVENTION

Figure 2:
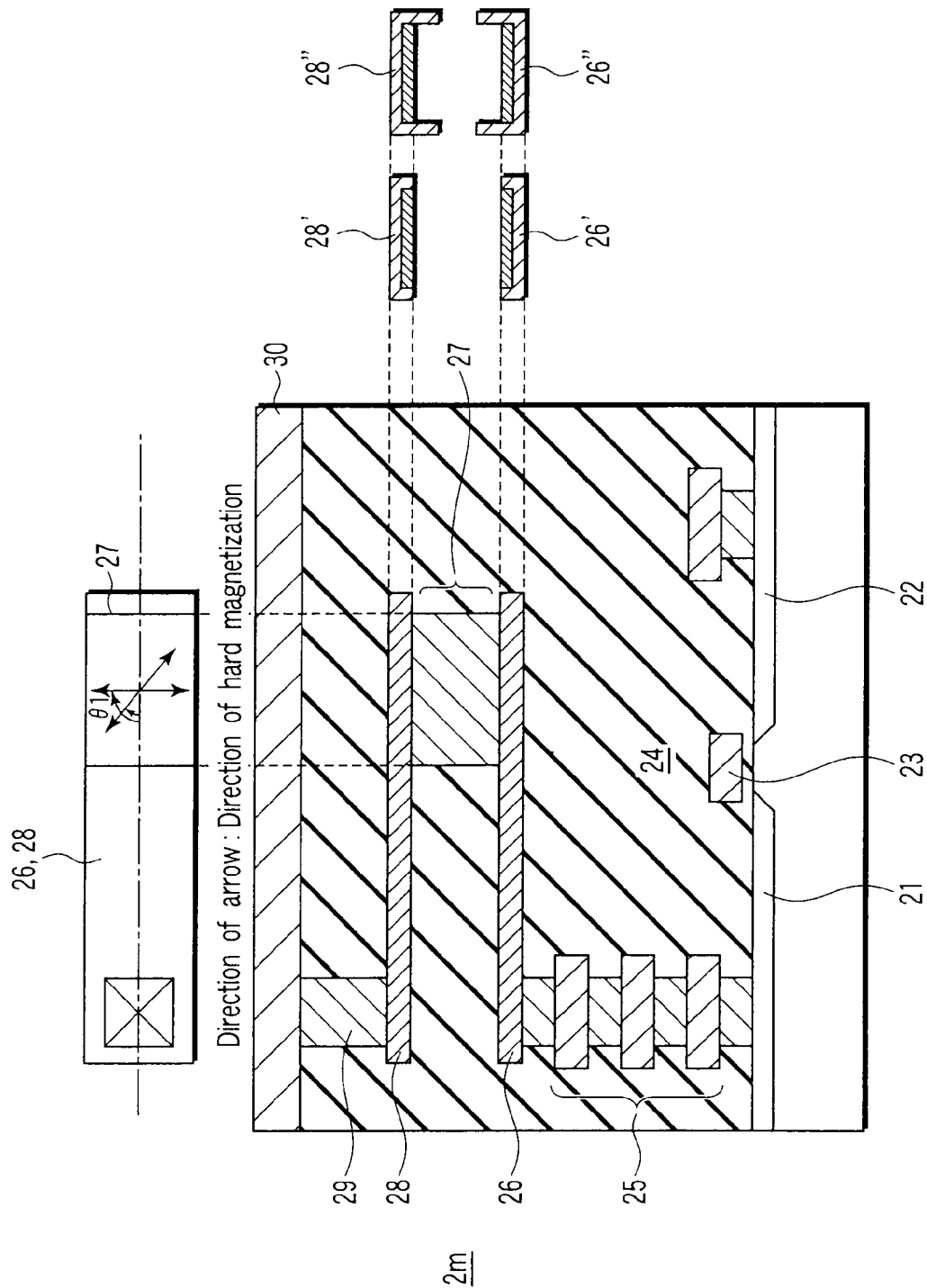
FIG. 2 is a sectional view showing a spin memory of a second embodiment.

A spin memory and a spin FET of an aspect of the present invention will be described below in detail with reference to the drawings.

1. Embodiments (1) First Embodiment

A configuration of a spin memory according to a first embodiment of the present invention is shown in FIG. 1.

In a spin memory 1m of this embodiment, a magneto-resistance element 17 is sandwiched between a lower electrode 16 and an upper electrode 18. The magneto-resistance element 17 is disposed at one end in the longitudinal direction of the lower electrode 16 and the upper electrode 18.

The magneto-resistance element 17 has a magnetic pinned layer in which a magnetization direction is pinned; a magnetic free layer in which a magnetization direction changes; and a nonmagnetic layer disposed therebetween (for example, a tunnel barrier layer).

A read/write compatible selector transistor 14 is connected via a plug 15 to the other end in the longitudinal direction of the lower electrode 16. A bit line 20 is connected via a plug 19 to the other end in the longitudinal direction of the upper electrode 18.

The read/write compatible selector transistor 14 has: source/drain diffusion layers 11, 12; and a gate electrode 13 formed via a gate insulation layer on a channel therebetween.

At the time of writing, the read/write compatible selector transistor 14 is turned ON, a current is supplied to the magneto-resistance element 17, and then, "1" or "0" is written utilizing spin injection magnetization inversion.

At the time of read, the read/write compatible selector transistor 14 is turned ON, and "1" or "0" is determined by using a magneto-resistance element serving as a reference cell formed on the same substrate.

Note that a read current in a spin memory using spin injection is set to be smaller than a write current.

At the time of writing, a magnetic field is generated from the lower electrode 16 and the upper electrode 18 due to the write current. When an angle θ1 formed between a direction of hard magnetization of a magnetic free layer of the magneto-resistance element 17 and a direction in which the lower electrode 16 or the upper electrode 18 extends is set in the range of 45 degrees≦θ1≦90 degrees, a magnetic field is applied to the magnetic free layer when the write current is applied, and then, spin injection magnetization inversion is assisted.

The shape of the magneto-resistance element 17 is not limited in particular.

In addition, when reading information that the magneto-resistance element 17 stores, although not shown, a sense current control element circuit for controlling a sense current, a driver, and a sinker are used.

Here in this example, while θ1 is defined as an angle in the case where an axis of hard magnetization is inclined clockwise when the other end is seen from one end in the longitudinal direction of the lower electrode 16 and the upper electrode 18, the axis of hard magnetization may be inclined by θ1 counterclockwise.

It is desirable that the magnetic pinned layer should have unidirectional anisotropy and that the magnetic free layer should have uni-axial anisotropy. In addition, it is preferable that the thickness should be in the range of 0.1 nm to 100 nm. Further, the film thickness of this ferromagnetic layer needs to be such that super paramagnetism is not obtained, and it is desirable that the thickness should be 0.4 nm or more.

In addition, a spin filter made of a nonmagnetic metal/a ferromagnetic metal/an anti-ferromagnetic metal is applied to the magnetic free layer of the magneto-resistance element 17, thereby making it possible to reduce a write current.

Further, an amorphous or microcrystal metal layer is inserted between the magneto-resistance element 17 and the lower electrode 16 and between the magneto-resistance element 17 and the upper electrode 18, thereby making it possible to reduce a switching magnetic field.

With the structure described above, writing due to spin injection magnetization inversion becomes possible with a small amount of a write current, and a structure in which a leak magnetic field for the adjacent cells can be restricted is provided, thus making it possible to decrease a probability of erroneous writing.

(2) Second Embodiment

A configuration of a spin memory according to a second embodiment of the present invention is shown in FIG. 2.

In a spin memory 2m of this embodiment, a magneto-resistance element 27 is sandwiched between a lower electrode 26 and an upper electrode 28. The magneto-resistance element 27 is disposed at one end in the longitudinal direction of the lower electrode 26 and the upper electrode 28.

The magneto-resistance element 27 has: a magnetic pinned layer in which a magnetization direction is pinned; a magnetic free layer in which a magnetization direction changes; and a nonmagnetic layer disposed therebetween (for example, a tunnel barrier layer).

A read/write compatible selector transistor 24 is connected via a plug 25 to the other end in the longitudinal direction of the lower electrode 26. A bit line 30 is connected via a plug 29 to the other end in the longitudinal direction of the upper electrode 28.

The read/write compatible selector transistor 24 has: source/drain diffusion layers 21, 22; and a gate electrode 23 formed via a gate insulation layer on a channel therebetween.

At the time of writing, the read/write compatible selector transistor 24 is turned ON, a current is supplied to the magneto-resistance element 27, and "1" or "0" is written utilizing spin injection magnetization inversion.

At the time of reading, the read/write compatible selector transistor 24 is turned ON, and, for example, "1" or "0" is determined utilizing a magneto-resistance element serving as a reference cell formed on the same substrate.

A read current in a spin memory employing spin injection is set to be smaller than a write current.

At the time of writing, a magnetic field is generated from the lower electrode 26 and the upper electrode by means of a write current. When an angle $\theta 1$ formed between a direction of hard magnetization of a magnetic free layer of the magneto-resistance element 27 and a direction in which the lower electrode 26 or the upper electrode 28 extends is set in the range of 45 degrees$\leq \theta 1 \leq$90 degrees, a magnetic field is applied to the magnetic free layer when the write current is applied, and then, spin injection magnetization inversion is assisted.

The shape of the magneto-resistance element 27 is not limited in particular.

In addition, a yoke is applied to the lower electrode 26 in order to efficiently apply a magnetic field to the magneto-resistance element 27. At this time, the yoke provided on the lower electrode 26 may not protrude from the lower electrode 26 as indicated by 26' or may protrude from the lower electrode 26 as indicated by 26".

Similarly, a yoke is applied to the upper electrode 28. At this time, the yoke provided on the upper electrode 28 may not protrude from the upper electrode 28 as indicated by 28' or may protrude from the upper electrode 28 as indicated by 28".

This yoke may be adapted to be added to only either one of the lower electrode 26 and the upper electrode 28.

In addition, when reading information that the magneto-resistance element 27 stores, although not shown, a sense current control element circuit for controlling a sense current, a driver, and a sinker are used.

Here, in this example, while $\theta 1$ is defined as an angle in the case where an axis of hard magnetization is inclined clockwise when the other end is seen from one end in the longitudinal direction of the lower electrode 26 and the upper electrode 28, the axis of hard magnetization may be inclined by $\theta 1$ counterclockwise.

It is desirable that the magnetic pinned layer should have unidirectional anisotropy and that the magnetic free layer should have uni-axial anisotropy. In addition, it is preferable that the thickness thereof should be in the range of 0.1 nm to 100 nm. Further, the film thickness of this ferromagnetic layer needs to be such that super paramagnetism is not obtained, and it is desirable that the thickness should be 0.4 nm or more.

In addition, a spin filter made of a nonmagnetic metal/a ferromagnetic metal/an anti-ferromagnetic metal is applied to the magnetic free layer of the magneto-resistance element 27, thereby making it possible to reduce a write current.

Further, an amorphous or microcrystal metal layer is inserted between the magneto-resistance element 27 and the lower electrode 26 and between the magneto-resistance element 27 and the upper electrode 28, thereby making it possible to reduce a switching magnetic field.

With the structure described above, writing due to spin injection magnetization inversion becomes possible with a small amount of a write current, and a structure in which a leak magnetic field for the adjacent cells can be restricted is provided, thus making it possible to decrease a probability of erroneous writing.

(3) Third Embodiment

Figure 3:
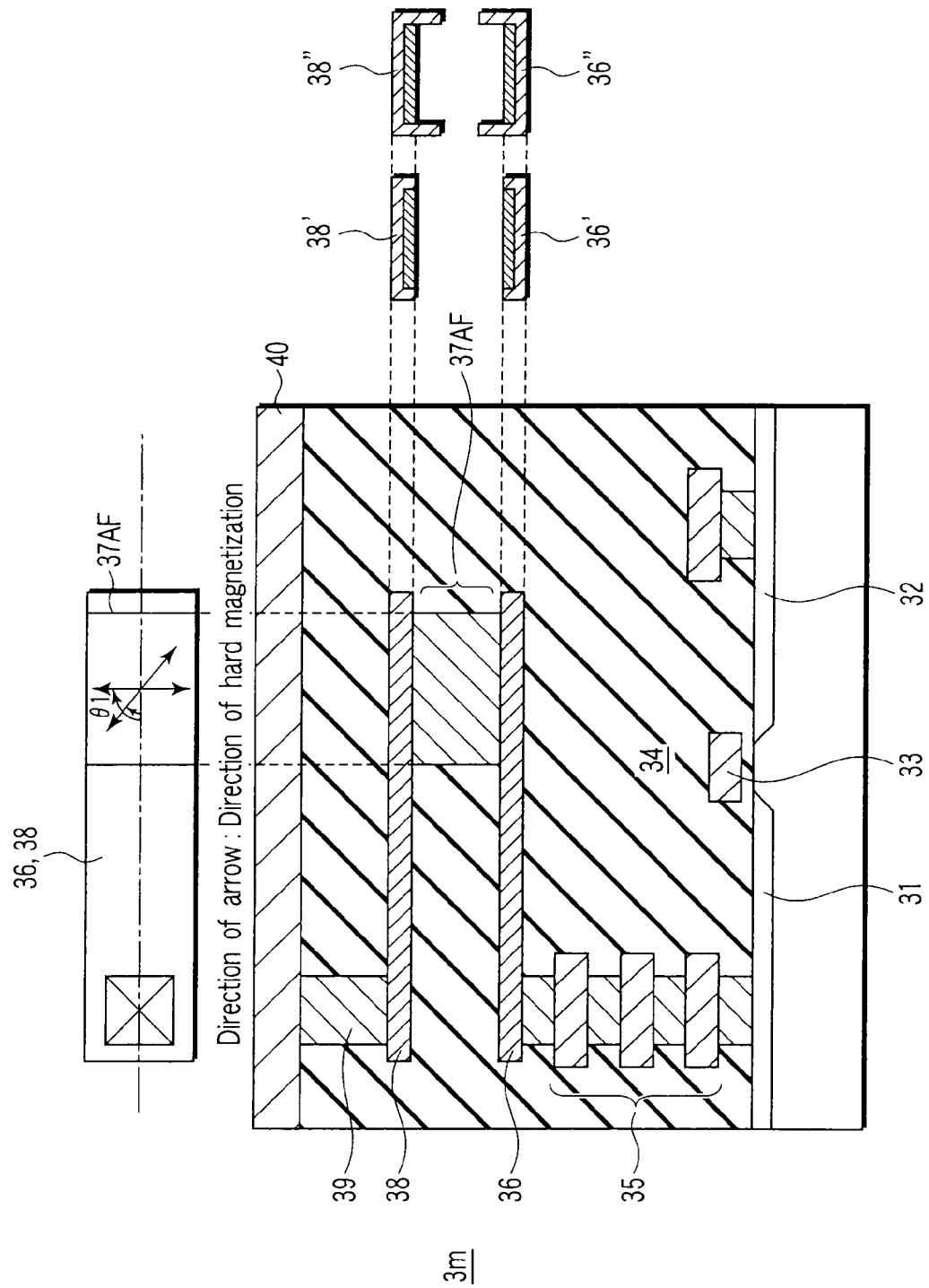
FIG. 3 is a sectional view showing a spin memory of a third embodiment.

A configuration of a spin memory according to a third embodiment of the present invention is shown in FIG. 3.

In a spin memory 3m of this embodiment, a magneto-resistance element 37AF is sandwiched between a lower electrode 36 and an upper electrode 38. The magneto-resistance element 37AF is disposed at one end in the longitudinal direction of the lower electrode 36 and the upper electrode 38.

The magneto-resistance element 37AF has: a magnetic pinned layer in which a magnetization direction is pinned; a magnetic free layer in which a magnetization direction changes; and a nonmagnetic layer disposed therebetween (for example, a tunnel barrier layer).

A read/write compatible selector transistor 34 is connected via a plug 35 to the other end in the longitudinal direction of the lower electrode 36. A bit line 40 is connected via a plug 39 to the other end in the longitudinal direction of the upper electrode 38.

The read/write compatible selector transistor 34 has source/drain diffusion layers 31, 32; and a gate electrode 33 formed via a gate insulation layer on a channel therebetween.

At the time of writing, the read/write compatible selector transistor 34 is turned ON, a current is supplied to the magneto-resistance element 37AF, and then, "1" or "0" is written utilizing spin injection magnetization inversion.

At the time of reading, the read/write compatible selector transistor 34 is turned ON, and, for example, "1" or "0" is determined utilizing a magneto-resistance element serving as a reference cell formed on the same substrate.

The magnetic free layer of the magneto-resistance element 37AF includes a structure of a ferromagnetic metal/an anti-ferromagnetic metal. For example, the magnetic free layer is composed of a ferromagnetic metal/a nonmagnetic metal/a ferromagnetic metal/an anti-ferromagnetic metal. The anti-ferromagnetic metal is constructed with a thin film to such an extent that unidirectional anisotropy cannot be attained.

In addition, by changing an angle of the spin memory 3*m* in the course of heat treatment in a magnetic field, a relative magnetization angle of the magnetic pinned layer and the magnetic free layer of the magneto-resistance element 37AF is adjusted in the range of 0 degree to 45 degrees.

A read current in the spin memory employing spin injection is set to be smaller than a write current.

At the time of writing, a magnetic field is generated from the lower electrode 36 and the upper electrode 38 by means of a write current. When an angle $\theta 1$ formed between a direction of hard magnetization of the magnetic free layer of the magneto-resistance element 37AF and a direction in which the lower electrode 36 or the upper electrode 38 extends is set in the range of 45 degrees $\leq \theta 1 \leq 90$ degrees, a magnetization field is applied to the magnetic free layer when a write current is applied, and then, spin injection magnetization inversion is assisted.

The shape of the magneto-resistance element 37AF is not limited in particular.

A yoke is applied to the lower electrode 36 in order to efficiently apply a magnetic field to the magneto-resistance element 37AF. At this time, the yoke provided on the lower electrode 36 may not protrude from the lower electrode 36 as indicated by 36' or may protrude from the lower electrode as indicated by 36".

Similarly, a yoke is applied to the upper electrode 38. At this time, the yoke provided on the upper electrode 38 may not protrude from the upper electrode 38 as indicated by 38' or may protrude from the upper electrode 38 as indicated by 38".

This yoke may be adapted to be added to only either one of the lower electrode 36 and the upper electrode 38. Although in this example, the yokes are applied to the lower electrode 36 and the upper electrode 38, they may not be applied.

In addition, when reading information that the magneto-resistance element 37AF stores, although not shown, a sense current control element circuit for controlling a sense current, a driver, and a sinker are used.

Here, in this example, while $\theta 1$ is defined as an angle in the case where an axis of hard magnetization is inclined clockwise when the other end is seen from one end in the longitudinal direction of the lower electrode 36 and the upper electrode 38, the axis of hard magnetization may be inclined by $\theta 1$ counterclockwise.

It is desirable that the magnetic pinned layer should have unidirectional anisotropy and that the magnetic free layer should have uni-axial anisotropy. In addition, it is preferable that the thickness thereof should be in the range of 0.1 nm to 100 nm. Further, the film thickness of this ferromagnetic layer needs to be such that super paramagnetism is not obtained, and it is desirable that the thickness should be 0.4 nm or more.

In addition, a spin filter made of a nonmagnetic metal/a ferromagnetic metal/an anti-ferromagnetic metal is applied to the magnetic free layer of the magneto-resistance element 37AF, thereby making it possible to reduce a write current.

Further, an amorphous or microcrystal metal layer is inserted between the magneto-resistance element 37AF and the lower electrode 36 and between the magneto-resistance element 37AF and the upper electrode 38, thereby making it possible to reduce a switching magnetic field.

With the structure described above, writing due to spin injection magnetization inversion becomes possible with a small amount of a write current, and a structure in which a leak magnetic field for the adjacent cells can be restricted is provided, thus making it possible to decrease a probability of erroneous writing.

In addition, a relative magnetization direction of the magnetic pinned layer and the magnetic free layer of the magneto-resistance element 37AF is shifted from being substantially parallel to each other or from being substantially anti-parallel to each other, thus improving spin injection efficiency and enabling spin injection writing with a small current.

(4) Fourth Embodiment

Figure 4:
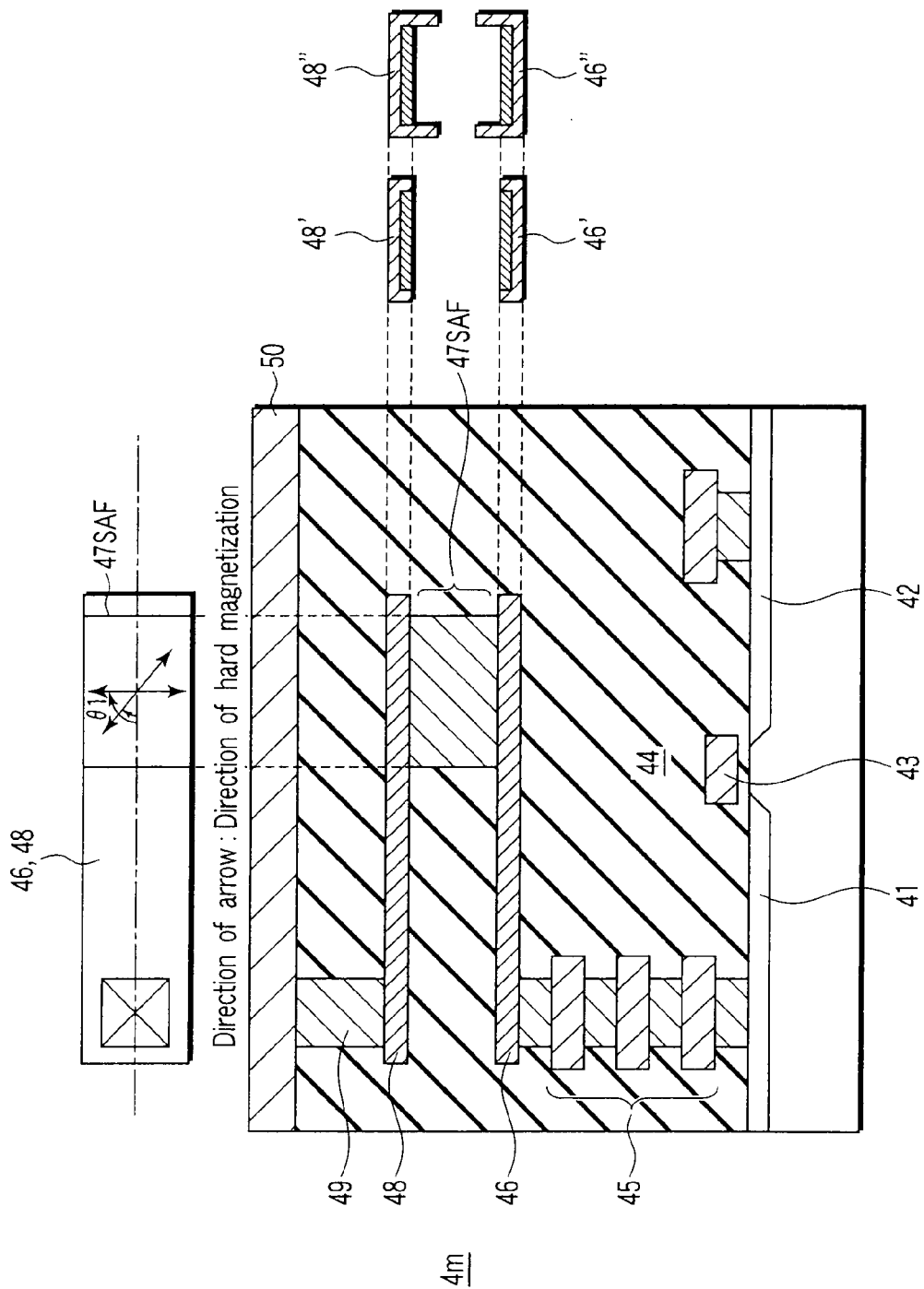
FIG. 4 is a sectional view showing a spin memory of a fourth embodiment.

A configuration of a spin memory according to a fourth embodiment of the present invention is shown in FIG. 4.

In a spin memory 4*m* of this embodiment, a magneto-resistance element 47SAF is sandwiched between a lower electrode 46 and an upper electrode 48. The magneto-resistance element 47SAF is disposed at one end in the longitudinal direction of the lower electrode 46 and the upper electrode 48.

The magneto-resistance element 47SAF has: a magnetic pinned layer in which a magnetization direction is pinned; a magnetic free layer in which a magnetic direction changes; and a nonmagnetic layer disposed therebetween (for example, a tunnel barrier layer).

A read/write compatible selector transistor 44 is connected via a plug 45 to the other end in the longitudinal direction of the lower electrode 46. A bit line 50 is connected via a plug 49 to the other end in the longitudinal direction of the upper electrode 48.

The read/write compatible selector transistor 44 has: source/drain dispersion layers 41, 42; and a gate electrode 43 formed via a gate insulation layer on a channel therebetween.

At the time of writing, the read/write compatible selector transistor 44 is turned ON, a current is supplied to the magneto-resistance element 47SAF, and "1" or "0" is written utilizing spin injection magnetization inversion.

At the time of reading, the read/write compatible selector transistor 44 is turned ON, and, for example, "1" or "0" is determined utilizing a magneto-resistance element serving as a reference cell formed on the same substrate.

The magnetic free layer of the magneto-resistance element 47SAF is composed of a SAF (synthetic anti-ferromagnetic) structure, for example, a ferromagnetic metal/a nonmagnetic metal/a ferromagnetic metal. In other words, the two ferromagnetic metals are bonded with each other via the nonmagnetic metal in an anti-ferromagnetic manner.

A read current in a spin memory employing spin injection is set to be smaller than a write current.

At the time of writing, a magnetic field is generated from the lower electrode 46 and the upper electrode 48 by means of a write current. When an angle formed between a direction of easy magnetization of the magnetic free layer of the magneto-resistance element 47SAF and a longitudinal direction of the lower electrode 46 and the upper electrode 48 is set in the range of 0 degree to 45 degrees, a magnetic field is applied to the magnetic free layer when a write current is applied, and then, spin injection magnetization inversion is assisted.

The shape of the magneto-resistance element 47SAF is not limited in particular.

A yoke is applied to the lower electrode 46 in order to efficiently apply a magnetic field to the magneto-resistance element 47SAF. At this time, the yoke provided on the lower electrode 46 may not protrude from the lower electrode 46 as indicated by 46' or may protrude from the lower electrode 46 as indicated by 46".

Similarly, a yoke is applied to the upper electrode 48. At this time, the yoke provided on the upper electrode 48 may not protrude from the upper electrode 48 as indicated by 48' or may protrude from the upper electrode 48 as indicated by 48".

This yoke may be adapted to be added to only either one of the lower electrode 46 and the upper electrode 48. In addition, while in the present embodiment, the yokes are added to the lower electrode 46 and the upper electrode 48, they may not be added.

In addition, when reading information that the magneto-resistance element 47SAF stores, although not shown, a sense current control element circuit for controlling a sense current, a driver, and a sinker are used.

Here in this example, while θ1 is defined as an angle in the case where an axis of hard magnetization is inclined clockwise when the other end is seen from one end in the longitudinal direction of the lower electrode 46 and the upper electrode 48, the axis of hard magnetization may be inclined by θ1 counterclockwise.

It is desirable that the magnetic pinned layer should have unidirectional anisotropy and the magnetic free layer should have uni-axial anisotropy. In addition, it is preferable that the thickness thereof should be in the range of 0.1 nm to 100 nm. Further, the film thickness of this ferromagnetic layer needs to be such that super paramagnetism is not obtained, and it is desirable that the thickness is 0.4 nm or more.

In addition, a spin filter made of a nonmagnetic metal/a ferromagnetic metal/an anti-ferromagnetic metal is applied to the magnetic free layer of the magneto-resistance element 47SAF, thereby making it possible to reduce a write current.

Further, an amorphous or microcrystal metal layer is inserted between the magneto-resistance element 47SAF and the lower electrode 46 and between the magneto-resistance element 47SAF and the upper electrode 48, thereby making it possible to reduce a switching magnetic field.

With the structure described, writing due to spin injection magnetization inversion becomes possible with a small amount of a write current, and a structure in which a leak magnetic field for the adjacent cells can be restricted is provided, thus making it possible to decrease a probability of erroneous writing.

(5) Fifth Embodiment

Figure 5:
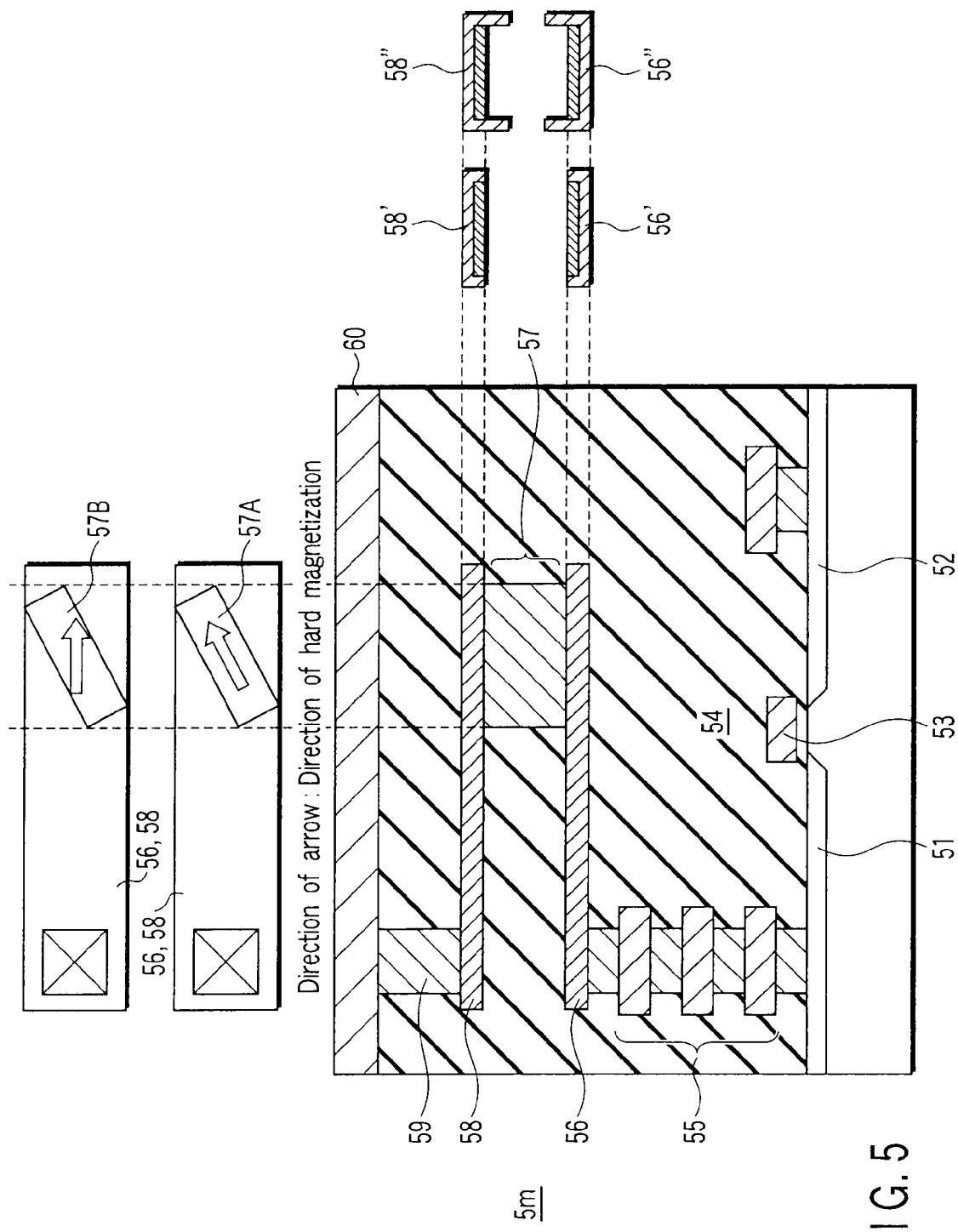
FIG. 5 is a sectional view showing a spin memory of a fifth embodiment.

A configuration of a spin memory according to a fifth embodiment of the present invention is shown in FIG. 5.

In a spin memory 5m of this embodiment, a magneto-resistance element 57 is sandwiched between a lower electrode 56 and an upper electrode 58. The magneto-resistance element 57 is disposed at one end in the longitudinal direction of the lower electrode 56 and the upper electrode 58.

The magneto-resistance element 57 has: a magnetic pinned layer in which a magnetization direction is pinned; a magnetic free layer in which a magnetic direction changes; and a nonmagnetic layer disposed therebetween (for example, a tunnel barrier layer).

A read/write compatible selector transistor 54 is connected via a plug 55 to the other end in the longitudinal direction of the lower electrode 56. A bit line 60 is connected via a plug 59 to the other end in the longitudinal direction of the upper electrode 58.

The read/write compatible selector transistor 54 has: source/drain diffusion layers 51, 52; and a gate electrode 53 formed via a gate insulation layer on a channel therebetween.

The magneto-resistance element 57 has a rectangular shape, and its longitudinal direction is different from the longitudinal direction of the lower electrode 56 and the upper electrode 58.

At the time of writing, the read/write compatible selector transistor 54 is turned ON, a current is supplied to the magneto-resistance element 57, and "1" or "0" is written utilizing spin injection magnetization inversion.

At the time of reading, the read/write compatible selector transistor 54 is turned ON, and, for example, "1" or "0" is determined utilizing a magneto-resistance element serving as a reference cell formed on the same substrate.

The magnetization direction of a magnetic pinned layer 57A and that of a magnetic free layer 57B, of the magneto-resistance element 57 are adjusted so that their relative magnetization angles are shifted from being parallel or anti parallel to each other, by changing an angle of the spin memory 5m in the course of heat treatment in a magnetic field.

For example, a relative magnetization angle θ2 of the magnetic pinned layer and the magnetic free layer of the magneto-resistance element 57 is adjusted to be 0 degree≦θ2≦45 degrees.

A read current in the spin memory employing spin injection is set to be smaller than a write current.

At the time of writing, a magnetic field is generated from the lower electrode 56 and the upper electrode 58 by means of a write current. When an angle θ1 formed between a direction of hard magnetization of the magnetic free layer of the magneto-resistance element 57 and the lower electrode 56 or the upper electrode 58 is set in the range of 45 degrees≦θ1≦90 degrees, a magnetic field is applied to the magnetic free layer when a write current is applied, and then, spin injection magnetization inversion is assisted.

The shape of the magneto-resistance element 57 is not limited in particular.

A yoke is applied to the lower electrode 56 in order to efficiently apply a magnetic field to the magnetic resistance effect element 57. At this time, the yoke provided on the lower electrode 56 may not protrude from the lower electrode 56 as indicated by 56' or may protrude from the lower electrode 56 as indicated by 56".

Similarly, a yoke is applied to the upper electrode 58. At this time, the yoke provided on the upper electrode 58 may not protrude from the upper electrode 58 as indicated by 58' or may protrude from the upper electrode 58 as indicated by 58".

This yoke may be adapted to be added to only either one of the lower electrode 56 and the upper electrode 58. In addition, while in the present embodiment, the yokes are added to the lower electrode 56 and the upper electrode 58, they may not be added.

In addition, when reading information that the magneto-resistance element 57 stores, although not shown, a sense current control element circuit for controlling a sense current, a driver, and a sinker are used.

It is desirable that the magnetic pinned layer should have unidirectional anisotropy and that the magnetic free layer should have uni-axial anisotropy. In addition, it is preferable that the thickness thereof should be in the range of 0.1 nm to 100 nm. Further, the film thickness of this ferromagnetic layer needs to be such that super paramagnetism is not obtained, and it is desirable that the thickness should be 0.4 nm or more.

Furthermore, a spin filter made of a nonmagnetic metal/a ferromagnetic metal/an anti-ferromagnetic metal is applied to the magnetic free layer of the magneto-resistance element 57, thereby making it possible to reduce a write current.

Moreover, an amorphous or microcrystal metal layer is inserted between the magneto-resistance element 57 and the lower electrode 56 and between the magneto-resistance element 57 and the upper electrode 58, thereby making it possible to reduce a switching magnetic field.

With the structure described above, writing due to spin injection magnetization inversion becomes possible with a small amount of a write current, and a structure in which a leak magnetic field for the adjacent cells can be restricted is provided, thus making it possible to decrease a probability of erroneous writing.

In addition, a relative magnetization direction of the magnetic pinned layer and the magnetic free layer of the magneto-resistance element 57 is shifted from being substantially parallel to each other or from being substantially anti parallel to each other, thus improving spin injection efficiency and enabling spin injection writing with a small current.

(6) Sixth Embodiment

Figure 6:
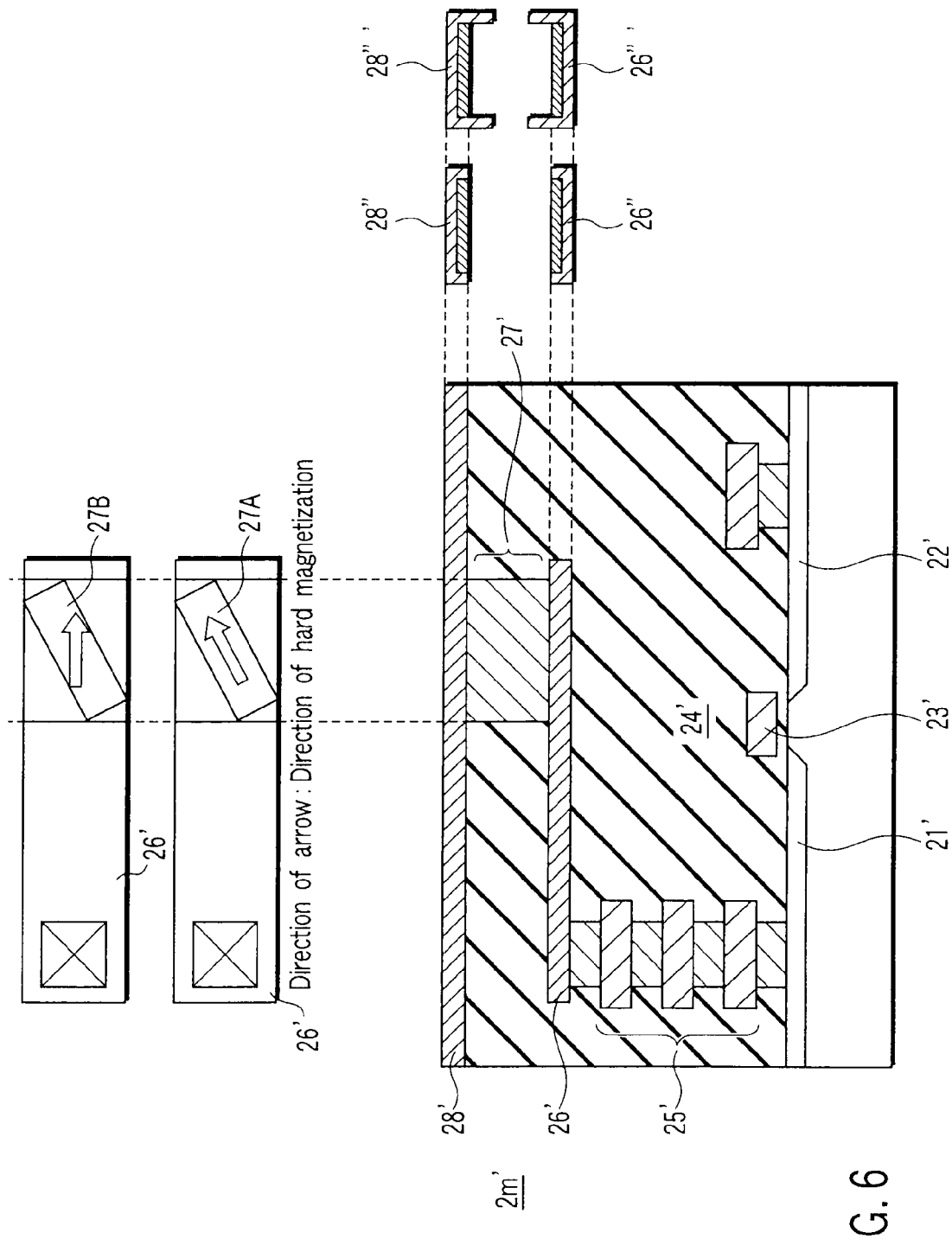
FIG. 6 is a sectional view showing a spin memory of a sixth embodiment.

A configuration of a spin memory according to a sixth embodiment of the present invention is shown in FIG. 6.

In a spin memory 2m' of this embodiment, a magneto-resistance element 27' is sandwiched between a lower electrode 26' and an upper electrode 28'. The magneto-resistance element 27' is disposed at one end in the longitudinal direction of the lower electrode 26'.

The magneto-resistance element 27' has: a magnetic pinned layer in which a magnetization direction is pinned; a magnetic free layer in which a magnetization direction changes; and a nonmagnetic layer disposed therebetween (for example, a tunnel barrier layer).

A read/write compatible selector transistor 24' is connected via a plug 25' to the other end in the longitudinal direction of the lower electrode 26'. The upper electrode 28' functions as a bit line.

The read/write compatible selector transistor 24' has: source/drain diffusion layers 21', 22'; and a gate electrode 23' formed via a gate insulation layer on a channel therebetween.

At the time of writing, the read/write compatible selector transistor 24' is turned ON, a current is supplied to the magneto-resistance element 27', and "1" or "0" is written utilizing spin injection magnetization inversion.

At the time of reading, the read/write compatible selector transistor 24' is turned ON, and, for example, "1" or "0" is determined utilizing a magneto-resistance element serving as a reference cell formed on the same substrate.

The magnetic free layer of the magneto-resistance element 27' is composed of a ferromagnetic metal/a nonmagnetic metal/a ferromagnetic metal/an anti-ferromagnetic metal. This anti-ferromagnetic metal is constructed with a film thickness to such an extent that unidirectional anisotropy cannot be attained.

In addition, in the case where the magnetization direction of the magnetic pinned layer is pinned with the anti-ferromagnetic metal, for example, the thickness of the anti-ferromagnetic metal of the magnetic free layer is made smaller than that of an anti-ferromagnetic metal for securely fixing the magnetization direction of the magnetic pinned layer.

Further, by changing an angle of the spin memory 2m' in the course of heat treatment in a magnetic field, a relative magnetization angle of the magnetic pinned layer and the magnetic free layer of the magneto-resistance element 27' is adjusted to form 0 to 45 degrees.

A read current in the spin memory employing spin injection is set to be smaller than a write current.

In addition, a yoke is applied to the lower electrode 26'. At this time, the yoke provided on the lower electrode 26' may not protrude from the lower electrode 26' as indicated by 26" or may protrude from the lower electrode 26' as indicated by 26'''.

Similarly, a yoke is applied to a bit line 28'. At this time, the yoke provided on the bit line 28' may not protrude from the bit line 28' as indicated by 28" or may protrude from the bit line 28' as indicated by 28'''.

This yoke may be adapted to be added to only either one of the lower electrode 26' and the bit line 28'. In addition, while in the present embodiment, the yokes are added to the lower electrode 26' and the upper electrode 28', they may not be added.

In addition, when reading information that the magneto-resistance element 27' stores, although not shown, a sense current control element circuit for controlling a sense current, a driver, and a sinker are used.

It is desirable that the magnetic pinned layer should have unidirectional anisotropy and that the magnetic free layer should have uni-axial anisotropy. In addition, it is preferable that the thickness thereof should be in the range of 0.1 nm to 100 nm. Further, the film thickness of this ferromagnetic layer needs to be such that super paramagnetism is not obtained, and it is desirable that the thickness should be 0.4 nm or more.

In addition, a spin filter made of a nonmagnetic metal/a ferromagnetic metal/an anti-ferromagnetic metal is applied to the magnetic free layer of the magneto-resistance element 27', thereby making it possible to reduce a write current.

Further, an amorphous or microcrystal metal layer is inserted between the magneto-resistance element 27' and the lower electrode 26' and between the magneto-resistance element 27' and the upper electrode 28', thereby making it possible to reduce a switching magnetic field.

In the memory 2m' of the present embodiment, a ferromagnetic metal/a nonmagnetic metal/a ferromagnetic metal/an anti-ferromagnetic metal are employed as a magnetic free layer, and an angle is inclined in the course of heat treatment in a magnetic field, whereby the direction of easy magnetization of the magnetic pinned layer is different from that of the magnetic free layer.

In other words, an angle θ2 formed between a magnetic moment of the magnetic pinned layer and that of a magnetic free layer is shifted from being parallel to or anti parallel to each other (for example, 0 degree≦θ2≦45 degrees), thus improving spin injection efficiency and enabling magnetization writing with low current density.

When an angle θ1 formed between a direction of hard magnetization of the magnetic free layer of the magneto-resistance element 27' and a direction in which the lower electrode 26' and the bit line 28' extend is set in the range of 45 degrees≦θ1≦90 degrees, a magnetic field is applied to the magnetic free layer when a write current is applied, and then, spin injection magnetization inversion is assisted, thereby enabling writing with further lower current density.

(7) Seventh Embodiment

Figure 7:
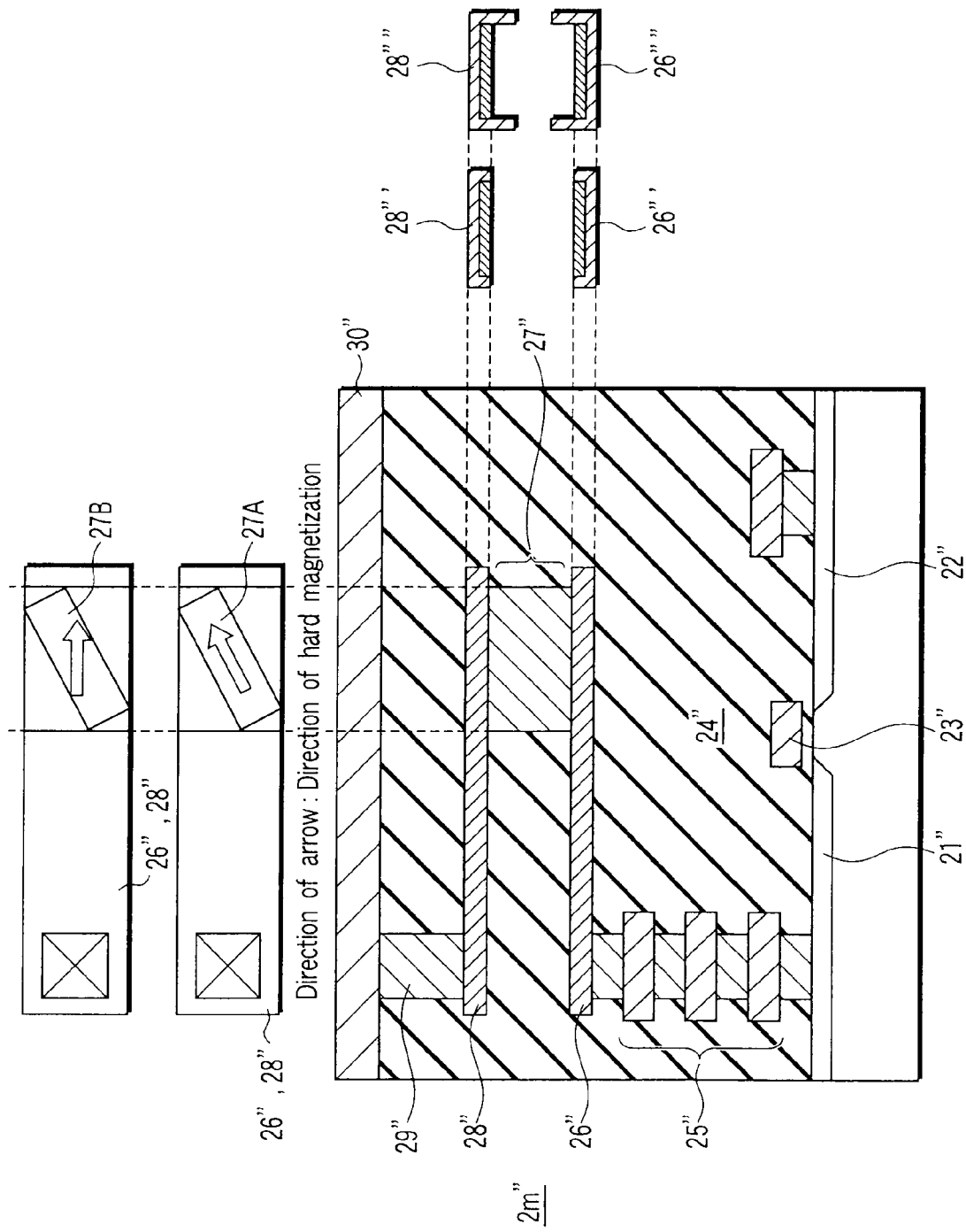
FIG. 7 is a sectional view showing a spin memory of a seventh embodiment.

A configuration of a spin memory according to a seventh embodiment of the present invention is shown in FIG. 7.

In a spin memory 2m" of this embodiment, a magneto-resistance element 27" is sandwiched between a lower electrode 26" and an upper electrode 28". The magneto-resistance element 27" is disposed at one end in the longitudinal direction of the lower electrode 26" and the upper electrode 28".

The magneto-resistance element 27" has: a magnetic pinned layer in which a magnetization direction is pinned; a magnetic free layer in which a magnetization direction changes; and a nonmagnetic layer disposed therebetween (for example, a tunnel barrier layer).

A read/write compatible selector transistor 24" is connected via a plug 25" to the other end in the longitudinal direction of the lower electrode 26". A bit line 30" is connected via a plug 29" to the other end in the longitudinal direction of the upper electrode 28".

The read/write compatible selector transistor 24" has: source/drain diffusion layers 21", 22"; and a gate electrode 23" formed via a gate insulation layer on a channel therebetween.

At the time of writing, the read/write compatible selector transistor 24" is turned ON, a current is supplied to the magneto-resistance element 27", and then, "1" or "0" is written utilizing spin injection magnetization inversion.

At the time of reading, the read/write compatible selector transistor 24" is turned ON, and, for example, "1" or "0" is determined utilizing a magneto-resistance element serving as a reference cell formed on the same substrate.

The magnetic free layer of the magneto-resistance element 27" is composed of a ferromagnetic metal/a nonmagnetic metal/a ferromagnetic metal/an anti-ferromagnetic metal. The anti-ferromagnetic metal is constructed with a thin film to such an extent that unidirectional anisotropy cannot be attained.

Further, by changing an angle of the spin memory 2m" in the course of heat treatment in a magnetic field, a relative magnetization angle of the magnetic pinned layer and the magnetic free layer of the magneto-resistance element 27" is adjusted to form 0 to 45 degrees.

A read current in a spin memory employing spin injection is set to be smaller than a write current.

In addition, a yoke is applied to the lower electrode 26". At this time, the yoke provided on the lower electrode 26" may not protrude from the lower electrode 26" as indicated by 26''' or may protrude from the lower electrode 26" as indicated by 26''''.

Similarly, a yoke is applied to the upper electrode 28". At this time, the yoke provided on the upper electrode 28" may not protrude from the upper electrode 28" as indicated by 28''' or may protrude from the upper electrode 28" as indicated by 28''''.

This yoke may be adapted to be added to only either one of the lower electrode 26" and the upper electrode 28". In addition, while in the present embodiment, the yokes are added to the lower electrode 26" and the upper electrode 28", they may not be added.

In addition, when reading information that the magneto-resistance element 27" stores, although not shown, a sense current control element circuit for controlling a sense current, a driver, and a sinker are used.

It is desirable that the magnetic pinned layer should have unidirectional anisotropy and that the magnetic free layer should have uni-axial anisotropy. In addition, it is preferable that the thickness thereof should be in the range of 0.1 nm to 100 nm. Further, the film thickness of this ferromagnetic layer needs to be such that super paramagnetism is not obtained, and it is desirable that the thickness should be 0.4 nm or more.

In addition, a spin filter made of a nonmagnetic metal/a ferromagnetic metal/an anti-ferromagnetic metal is applied to the magnetic free layer of the magneto-resistance element 27", thereby making it possible to reduce a write current.

Further, an amorphous or microcrystal metal layer is inserted between the magneto-resistance element 27" and the lower electrode 26" and between the magneto-resistance element 27" and the upper electrode 28", thereby making it possible to reduce a switching magnetic field.

In the memory 2m" of the present embodiment, a ferromagnetic metal/a nonmagnetic metal/a ferromagnetic metal/ an anti-ferromagnetic metal are employed as a magnetic free layer, and an angle is inclined in the course of heat treatment in a magnetic field, whereby the direction of easy magnetization of the magnetic pinned layer is different from that of the magnetic free layer.

In other words, an angle $\theta 2$ formed between a magnetic moment of the magnetic pinned layer and that of a magnetic free layer is shifted from being parallel to or anti parallel to each other (for example, 0 degree$\leqq \theta 2 \leqq$45 degrees), thus improving spin injection efficiency and enabling magnetization writing with low current density.

When an angle $\theta 1$ formed between a direction of hard magnetization of the magnetic free layer of the magneto-resistance element 27" and each of the lower electrode 26" and the upper line 28" is set in the range of 45 degrees$\leqq \theta 1 \leqq$90 degrees, a magnetic field is applied to the magnetic free layer when a write current is applied, and then, spin injection magnetization inversion is assisted, thereby enabling writing with further lower current density.

In addition, a structure in which a leak magnetic field for the adjacent cells can be restricted is provided, thus making it possible to decrease a probability of erroneous writing.

(8) Eighth Embodiment

Figure 8:
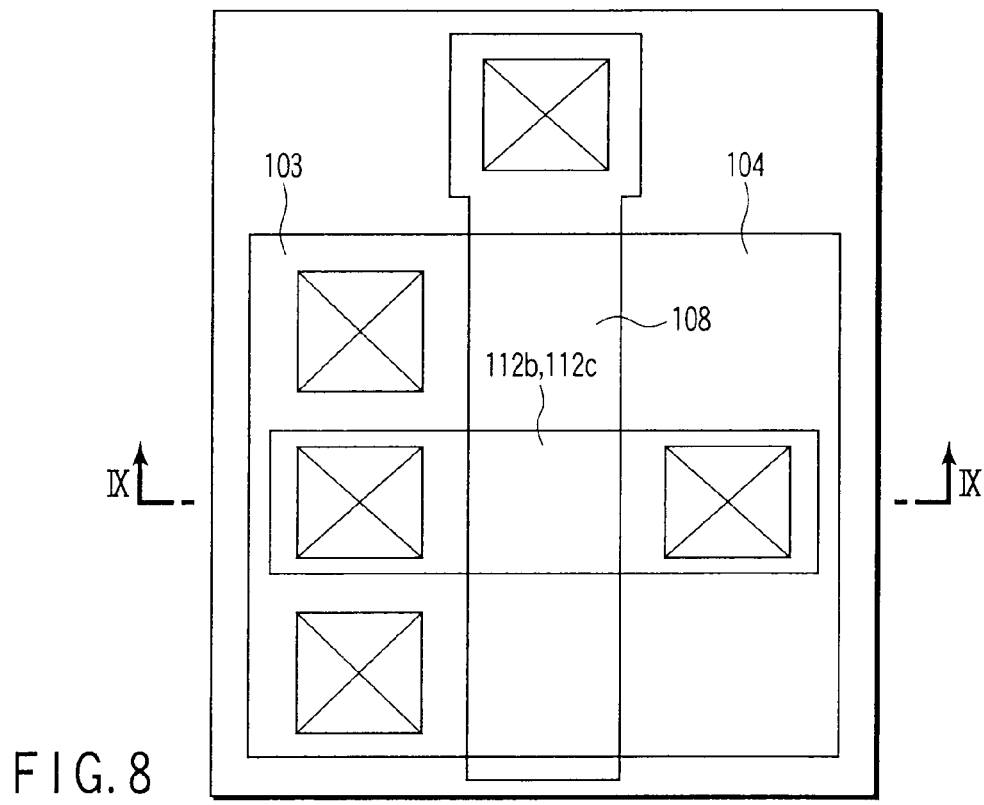
FIG. 8 is a sectional view showing a spin memory of an eighth embodiment.
Figure 9:
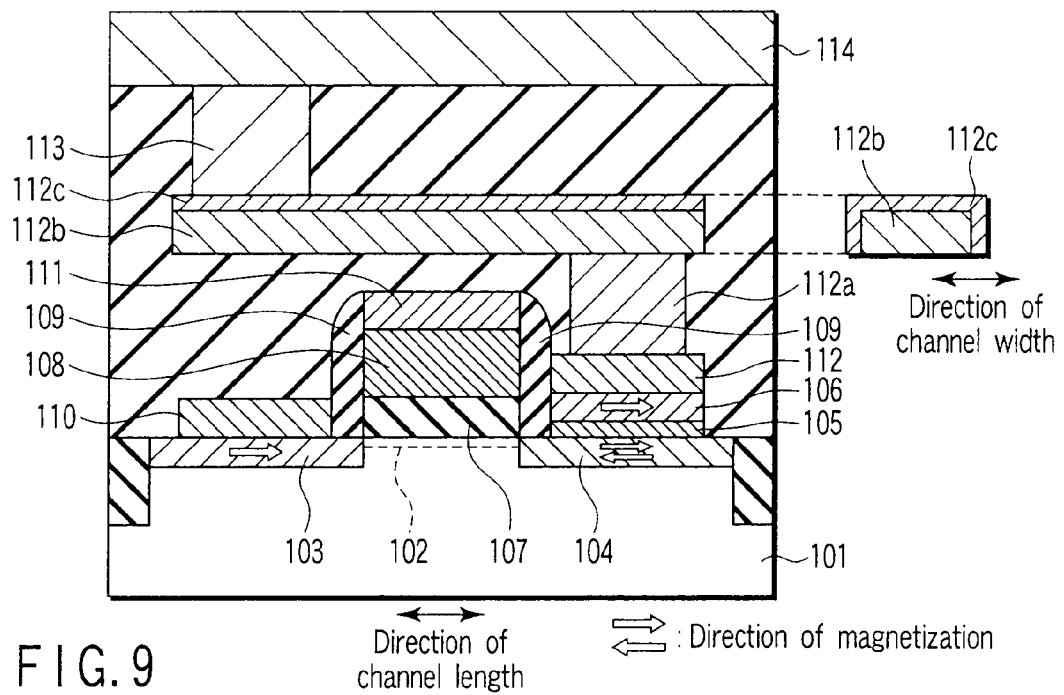
FIG. 9 is a sectional view taken along the line IX-IX of FIG. 8.

A configuration of a spin FET according to an eighth embodiment of the present invention is shown in FIGS. 8 and 9.

A first ferromagnetic layer 103 and a second ferromagnetic layer 104 are embedded and formed on a surface of a semiconductor substrate 101. A nonmagnetic layer 105 and a third ferromagnetic layer 106 are laminated on the second ferromagnetic layer 104. Magnetization of the first and third ferromagnetic layers 103 and 106 is pinned, and the magnetization direction of the first ferromagnetic layer 104 can vary.

Between the first ferromagnetic layer 103 and the second ferromagnetic layer 104 is electrically connected in a channel area 102, a gate insulation film 107 is formed on this channel area 102, and further, a gate electrode 108 is formed on the gate insulation film 107. Electrodes 110, 111, 112 also serving as protective layers are formed at an upper part of each layer.

At the time of magnetization writing of an electric field effect transistor of this structure, a current is supplied between the second ferromagnetic layer 104 and the third ferromagnetic layer 106. The channel area 102 may or may not be included in a current path.

By means of this current, spin-polarized electrons are supplied between the ferromagnetic layers, and then, a spin torque is generated. As a result, so called spin injection magnetization inversion occurs, and then, the magnetization direction of the second ferromagnetic layer 104 changes. The direction of this magnetization change can be varied according to an orientation in which a current is supplied.

One end of each of local conductive lines 112b, 112c is connected to the electrode 112. The local conductive lines 112b, 112c are locally disposed on an electric field effect transistor. In addition, the other end of each of the local conductive lines 112b, 112c is connected via a plug 113 to a conductive line 114 whose layer is upper than the local conductive lines 112b, 112c. The local conductive lines 112b, 112c may be connected to the electrode 110 instead of the electrode 112.

Then, at the time of the magnetization writing described above, the magnetic field generated by means of the current supplied to the local conductive lines 112b, 112c is applied to the second ferromagnetic layer 104 serving as a magnetic free layer, and is used as assistance for spin injection magnetization writing.

The layout of the local conductive lines 112b, 112c is determined so that this magnetic field is applied in a direction of hard magnetization of the second ferromagnetic layer 104, for example.

The local conductive lines 112b, 112c may be disposed so as to extend in a direction of 45 degrees≦θ1≦90 degrees relative to the axis of hard magnetization of the second ferromagnetic layer 104. The direction in which the axis of hard magnetization is inclined by θ1 relative to the local conductive lines 112b, 112c may be clockwise or counterclockwise.

By employing such a structure, the magnetic field generated from the local conductive lines 112b, 112c can be utilized as assistance for magnetization inversion, and thus spin injection magnetization inversion can be easily carried out. In this manner, the current required for magnetization writing of the second ferromagnetic layer 104 can be reduced.

In this example, the local conductive lines 112b, 112c for generating an assisted magnetic field have a yoke structure. A magnetic field can be efficiently generated by providing a yoke structure. However, even if the yoke structure is not provided, it is possible to generate an assisted magnetic field. Thus, the yoke structure is not indispensable.

Note that, as shown in FIG. 10, a tunnel barrier layer (nonmagnetic layer) 115 may be applied between at least one of the ferromagnetic layer 103 serving as a magnetic pinned layer and the ferromagnetic layer 104 serving as a magnetic free layer, and the channel area 102.

Next, a method for manufacturing a spin FET of FIGS. 8 and 9 will be described below.

First, a channel area 102 is formed on a semiconductor substrate 101 by employing implantation and annealing, and then, a gate insulation film 107 and a gate electrode 108 are formed. Next, in the semiconductor substrate 101, a portion at which a source electrode 103 and a drain electrode 104 are embedded is removed by means of etching to form a recessed portion.

Next, a ferromagnetic film is embedded in this recessed portion to form a first ferromagnetic layer 103 and a second ferromagnetic layer 104, and then, electrodes 110, 111, and 112 serving as a nonmagnetic layer 105, a third ferromagnetic layer 106, and a protective layer are laminated.

Lastly, one-hour annealing is carried out at 270° C. in a uniform magnetic field of 1 T in order to apply magnetic anisotropy to the first ferromagnetic layer 103, the second ferromagnetic layer 104, and the third ferromagnetic layer 106.

Tunnel barriers are inserted into an interface between the first ferromagnetic layer 103 and the second ferromagnetic layer 104 and a semiconductor substrate, whereby spin injection efficiency is enhanced, and transistor performance can be improved.

(9) Ninth Embodiment

Figure 11:
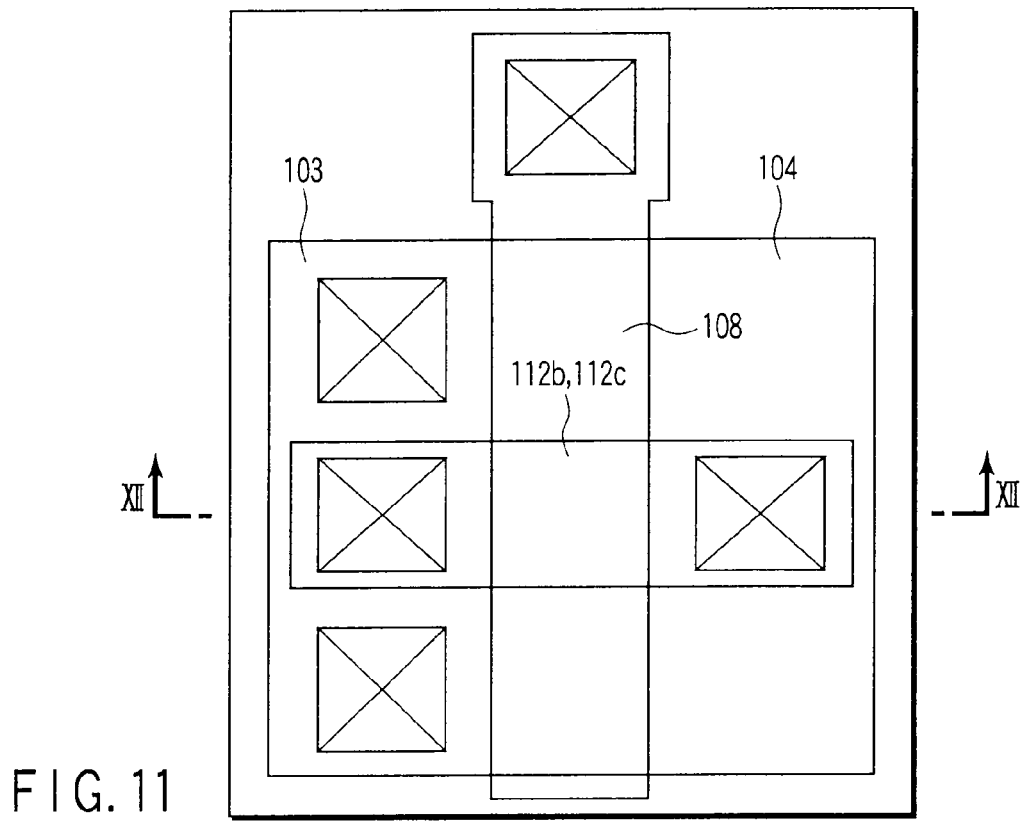
FIG. 11 is a plan view showing a spin FET of a ninth embodiment.
Figure 12:
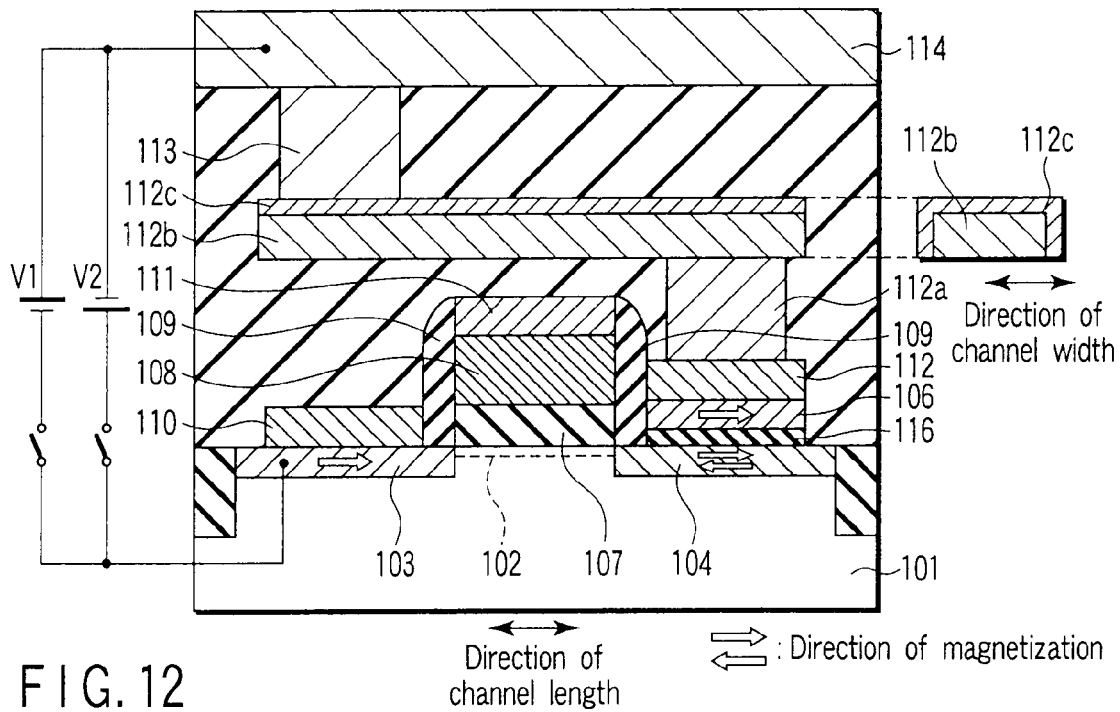
FIG. 12 is a sectional view taken along the line XII-XII of FIG. 11.

A configuration of a spin FET according to a ninth embodiment of the present invention is shown in FIGS. 11 and 12.

A first ferromagnetic layer 103 and a second ferromagnetic layer 104 are embedded and formed on a surface of a semiconductor substrate 101. A tunnel barrier layer 116 and a third ferromagnetic layer 106 are laminated on the second ferromagnetic layer 104. The magnetization of the first and third ferromagnetic layers 103, 106 is pinned, and the magnetization direction of the first ferromagnetic layer 104 can vary.

Between the first ferromagnetic layer 103 and the second ferromagnetic layer 104 is electrically connected in a channel area 102, a gate insulation film 107 is formed on this channel area 102, and further, a gate electrode 108 is formed on the gate insulation film 107. Electrodes 110, 111, 112 serving as protective layers are formed on an upper part of each layer.

At the time of magnetization writing of an electric field effect transistor of this structure, the electric field effect transistor is turned ON, and then, a current is supplied to a magneto-resistance element MTJ in a path including the channel 102. Specifically, voltages V1, V2 oriented according to write data may be selectively applied between the first ferromagnetic layer 103 and the conductive line 114.

By means of this current, spin-polarized electrons are supplied between the second and third ferromagnetic layers 104 and 106, and then, a spin torque is generated. As a result, so called spin injection magnetization inversion occurs, and then, the magnetization direction of the second ferromagnetic layer 104 changes.

One end of each of local conductive lines 112b, 112c is connected to the electrode 112. The local conductive lines 112b, 112c are locally disposed on an electric field effect transistor. In addition, the other end of each of the local conductive lines 112b, 112c is connected via a plug 113 to a conductive line 114 whose layer is upper than the local conductive lines 112b, 112c. The local conductive lines 112b, 112c may be connected to the electrode 110 instead of the electrode 112.

Then, at the time of the magnetization writing described above, the magnetic field generated by means of the current supplied to the local conductive lines 112b, 112c is applied to the second ferromagnetic layer 104 serving as a magnetic free layer, and is used as assistance for spin injection magnetization writing.

The layout of the local conductive lines 112b, 112c is determined so that this magnetic field is applied in a direction of hard magnetization of the second ferromagnetic layer 104, for example.

The local conductive lines 112b, 112c may be disposed so as to extend in a direction of 45 degrees≦θ1≦90 degrees relative to the axis of hard magnetization of the second ferromagnetic layer 104. The direction in which the axis of hard magnetization is inclined by θ1 relative to the local conductive lines 112b, 112c may be clockwise or counterclockwise.

By employing such a structure, the magnetic field generated from the local conductive lines 112b, 112c can be utilized as assistance for magnetization inversion, and thus spin injection magnetization inversion can be easily carried out. In this manner, the current required for magnetization writing of the second ferromagnetic layer 104 can be reduced.

In this example, the local conductive lines 112b, 112c for generating an assisted magnetic field have a yoke structure. A magnetic field can be efficiently generated by providing a yoke structure. However, even if the yoke structure is not provided, it is possible to generate an assisted magnetic field. Thus, the yoke structure is not indispensable.

A tunnel barrier layer (nonmagnetic layer) may be applied between at least one of the ferromagnetic layer 103 serving as a magnetic pinned layer and the ferromagnetic layer 104 serving as a magnetic free layer, and the channel area 102.

(10) Tenth Embodiment

A configuration of a spin FET according to a tenth embodiment of the present invention is shown in FIGS. 13 and 14.

A first ferromagnetic layer 103 and a second ferromagnetic layer 104 are embedded and formed on a surface of a semiconductor substrate 101. A tunnel barrier layer 116 and a third ferromagnetic layer 106 are laminated on the second ferromagnetic layer 104. The magnetization of the first and third ferromagnetic layers 103, 106 is pinned, and the magnetization direction of the first ferromagnetic layer 104 can vary.

Between the first ferromagnetic layer 103 and the second ferromagnetic layer 104 is electrically connected in a channel area 102, a gate insulation film 107 is formed on this channel area 102, and further, a gate electrode 108 is formed on the gate insulation film 107. Electrodes 110, 111, 112 serving as protective layers are formed on an upper part of each layer.

At the time of magnetization writing of an electric field effect transistor of this structure, the electric field effect transistor is turned OFF, and then, a current is supplied to a magneto-resistance element MTJ in a path that does not include the channel 102. Specifically, voltages V1, V2 oriented according to write data may be selectively applied between the second ferromagnetic layer 104 and the conductive line 114.

By means of this current, spin-polarized electrons are supplied between the second and third ferromagnetic layers 104 and 106, and then, a spin torque is generated. As a result, so called spin injection magnetization inversion occurs, and then, the magnetization direction of the second ferromagnetic layer 104 changes.

One end of each of local conductive lines 112b, 112c is connected to the electrode 112. The local conductive lines 112b, 112c are locally disposed on the electric field effect transistor. In addition, the other end of each of the local conductive lines 112b, 112c is connected via a plug 113 to a conductive line 114 whose layer is upper than the local conductive lines 112b, 112c.

Then, at the time of the above magnetization writing, the magnetic field generated by means of a current supplied to the local conductive lines 112b, 112c is applied to the second ferromagnetic layer 104 serving as a magnetic free layer, and is used as assistance for spin injection magnetization writing.

The layout of the local conductive lines 112b, 112c is determined so that this magnetic field is applied in a direction of hard magnetization of the second ferromagnetic layer 104, for example.

The local conductive lines 112b, 112c may be disposed so as to extend in a direction of 45 degrees$\leq \theta 1 \leq 90$ degrees relative to the axis of hard magnetization of the second ferromagnetic layer 104. The direction in which the axis of hard magnetization is inclined by $\theta 1$ relative to the local conductive lines 112b, 112c may be clockwise or counterclockwise.

By employing such a structure, the magnetic field generated from the local conductive lines 112b, 112c can be utilized as assistance for magnetization inversion, and thus spin injection magnetization inversion can be easily carried out. In this manner, the current required for magnetization writing of the second ferromagnetic layer 104 can be reduced.

Also in this example, as in the ninth embodiment, the local conductive lines 112b, 112c for generating an assisted magnetic field may not have a yoke structure.

In addition, a tunnel barrier layer (nonmagnetic layer) may be applied between at least one of the ferromagnetic layer 103 serving as a magnetic pinned layer and the ferromagnetic layer 104 serving as a magnetic free layer, and the channel area 102.

(11) Other Embodiments

In the first to eighth embodiments described above, an anti-ferromagnetic layer for securely pinning magnetization of a ferromagnetic layer serving as a magnetic pinned layer may be provided.

It is desirable that at least one of the magnetic pinned layer and the magnetic free layer should have a SAF structure. The intensity of a magnetic interaction generated between two magnetic layers to be SAF-coupled is 0.25 erg/cm² or more. In addition, a magnetic pinned layer is applied to a magnetic free layer via a nonmagnetic layer, and then, a function as a spin filter may be applied.

Further, an angle formed by a magnetic moment of the magnetic pinned layer and that of the magnetic free layer is shifted from being parallel or anti-parallel to each other, whereby magnetization inversion efficiency is improved.

For example, in the case where the magnetic free layer and the magnetic pinned layer are formed in a rectangular shape, the magnetization direction of the remanent magnetization of the magnetic pinned layer is inclined relative to a long axis of the rectangle, and the magnetization direction of the remanent magnetization of the magnetic free layer is made parallel to the long axis of the rectangle.

In addition, in the case where the magnetic free layer and the magnetic pinned layer are formed in an elliptical shape, the magnetization direction of the remanent magnetization of the magnetic pinned layer is inclined relative to a long axis of the elliptical shape, and the magnetization direction of the remanent magnetization of the magnetic free layer is made parallel to the long axis of the elliptical shape.

In addition, in the case where the magnetic free layer and the magnetic pinned layer are a parallelogram, the magnetization direction of the remanent magnetization of the magnetic pinned layer is inclined relative to a long edge of the parallelogram, and the magnetization direction of the remanent magnetization of the magnetic free layer is made parallel to the long edge of the parallelogram.

Further, in the case where the magnetic free layer and the magnetic pinned layer are formed in a shape having two axes, in the magnetization direction of the remanent magnetization of the magnetic pinned layer, an angle formed relative to one of the two axes is set positive, and then, an angle formed relative to the other one of the two axes is set negative.

In the magneto-resistance element, it is desirable that an angle $\theta 2$ formed between the magnetization direction of the magnetic pinned layer and the magnetization direction of the magnetic free layer should be $\theta x$ or ($180$ degrees$-\theta x$) relative to $\theta x$ defined by polarization rate P, $\alpha=(P^{1/2}+P^{-1/2})^{3/4}$, $\beta=-4+3\alpha$ and $\theta x=\arccos(-\alpha/\beta)$.

In addition, in the magneto-resistance element, it is desirable that the angle $\theta 2$ formed between the magnetization direction of the magnetic pinned layer and the magnetization direction of the magnetic free layer should be $\theta y$ or ($180$ degrees$-\theta y$) relative to $\theta y$ defined by polarization rate P, $\alpha=(P^{1/2}+P^{-1/2})^{3/4}$, $\beta=-4+3\alpha$ and $\theta y=\arccos[\{(2\alpha^2-\beta^2)/\alpha^2\}^{1/2}]$.

The angle $\theta 2$ formed between the magnetization direction of the magnetic pinned layer and the magnetization direction of the magnetic free layer may be set in the range of 5 degrees to $\theta x$ or $\theta y$, or in the range of ($180$ degrees$-\theta x$) or ($180$ degrees$-\theta y$) to 175 degrees.

Here, an amorphous metal or a microcrystal metal may be applied onto the magnetic resistance effect element.

The amorphous metal or microcrystal metal is (i) an alloy including at least one element of Ti, Zr, Hf, V, Nb, Ta, Cr, Mo, and W and at least one element of Pt, Pd, Ru, Rh, Ir, Os, Re, Au, and Al; (ii) an alloy including at least one element of Ti, Zr, Hf, V, Nb, Ta, Cr, Mo, and W and at least one element of Fe, Ni, Cr, and Cu; (iii) an alloy including at least one element of Pr, Nd, Pm, Sm, Eu, Gd, Tb, Dy, Ho, Er, Tm, Yb, and Lu and at least one element of Pt, Pd, Ru, Rh, Ir, Os, Re, Au, and Al; or (iv) Indium-Titan-Oxide, Indium-Zinc-Oxide, Al-Oxide, or Al-Nitride.

2. Applied Examples

Now, applied examples will be described here.

(1) First Applied Example

A magneto-resistance element 21m was fabricated as a first applied example of the present invention.

Procedures for manufacturing this magneto-resistance element (sample) are as follows.

First, a wired groove is formed at $SiO_2$ on a semiconductor substrate by means of photolithography and RIE (Reactive Ion Etching).

Then, by means of a sputtering technique, a bottom face and a side face of the wired groove are coated with a yoke consisting of NiFe, and further, by means of a plating technique, the wired groove is filled with Cu. Then, by means of CMP (Chemical Mechanical Polishing), redundant Cu outside of the wired groove is removed, and then, a lower electrode (lower wire) 213 is formed.

Next, a metal layer consisting of Ta (50 nm)/Ru (10 nm); an anti-ferromagnetic layer consisting of PtMn (20 nm); a magnetic pinned layer consisting of CoFe (4 nm)/Ru (0.8 nm)/CoFeB (4 nm); a tunnel barrier layer consisting of MgO (0.5 nm); a magnetic free layer consisting of CoFeB (2.0 nm); and a contact layer consisting of Ta (150 nm) are sequentially formed on the lower electrode 213 by means of a sputtering technique, thereby completing a magneto-resistance element 211. The numeric values enclosed in parentheses represent the thickness of each material.

Here, with respect to formation of tunnel junction, an EB (Electron Beam) drawing device is employed for a portion defining a junction area thereof, and a KrF stepper device is employed for the other portion, to carry out lithography. In addition, junction separation is carried out using Ar-ion milling.

Next, a protective layer with a thickness of about 35 nm, consisting of SiOx, is formed. A surface of Ta is exposed by etching-back.

In addition, an upper electrode 212 consisting of Ti (15 nm)/Al (300 nm)/Ti (15 nm) is formed on a metal layer by means of the sputtering technique. The upper electrode 212 is patterned by means of RIE (Reactive Ion Etching) after lithography has been carried out using the KeF stepper device.

Lastly, a yoke consisting of NiFe is formed by means of the sputtering technique. Then, lithography is carried out using the KeF stepper device, followed by patterning by means of the Ar-ion milling.

The axis of hard magnetization of the magnetic free layer of the magneto-resistance element 211 was defined as a direction vertical to a direction in which the upper electrode 212 and the lower electrode 213 extend, in other words, as a direction vertical to a paper face. In addition, by applying a magnetic filed in the long-axis direction of a magnetic layer, and then, carrying out 10-hour annealing at 280° C., single-axis anisotropy was applied to the magnetic layer.

Spin injection magnetization inversion was attempted with respect to samples fabricated in accordance with the procedures described above. Specific procedures are as follows.

First, a pulse voltage is applied between a terminal a of a lower electrode 213 sampled and a terminal d of an upper electrode 212 sampled. Then, a resistance between the upper electrode 212 and the lower electrode 213, i.e., a resistance of the magneto-resistance element 211 is measured by means of a direct current 4-terminal technique.

When the application of the pulse voltage and measurement of a magnetic resistance were repeated, the current $I_C$ (P→AP) required for spin injection magnetization inversion was 3.7 mA.

Next, an operation of applying a pulse voltage between the terminal a of the lower electrode 213 sampled and a terminal c of the upper electrode 212 sampled, and then, measuring a resistance of the magneto-resistance element 211 was repeatedly carried out, and the current $I_C$ (P→AP) required for spin injection magnetization inversion was 3.1 mA.

Upon comparison of the results obtained above, it is found that a value of a current required for spin injection magnetization inversion is smaller by applying a pulse voltage between the terminal a of the lower electrode 213 and the terminal c of the upper electrode 212 rather than applying a pulse voltage between the terminal a of the lower electrode 213 and the terminal d of the upper electrode 212.

This is because, in the case where a pulse voltage is applied between the terminal a of the lower electrode 213 and the terminal d of the upper electrode 212, the pulse currents flowing through the lower electrode 213 and the upper electrode 212 each generates a magnetic field, whereas only a small amount of magnetic field is applied to the magnetic free layer because the mutual magnetic fields eliminate each other at a position of the magneto-resistance element 211.

On the other hand, in the case where a pulse voltage is applied between the terminal a of the lower electrode 213 and the terminal c of the upper electrode 212, a strong magnetic field is applied to the magnetic free layer because the magnetic fields in which the pulse current flowing through the lower electrode 213 and the upper electrode 212 is generated are strengthened by each other at a position of the magneto-resistance element 211.

It has been shown that spin injection magnetization inversion becomes possible with a low current because of the assistance due to this magnetic field.

Therefore, an ideal structure of a magneto-resistance element, as shown in FIG. 16, is such that the magneto-resistance element 211 is disposed at one end of each of the lower electrode 213 and the upper electrode 212, and then, the lower electrode 213 and the upper electrode 212 extend in a vertical direction relative to an axis of hard magnetization of the magnetic free layer of the magneto-resistance element 211.

Next, simulation was carried out with respect to a magnetic field generated when memory cells were configured using the magneto-resistance element of FIG. 16.

Figure 17:
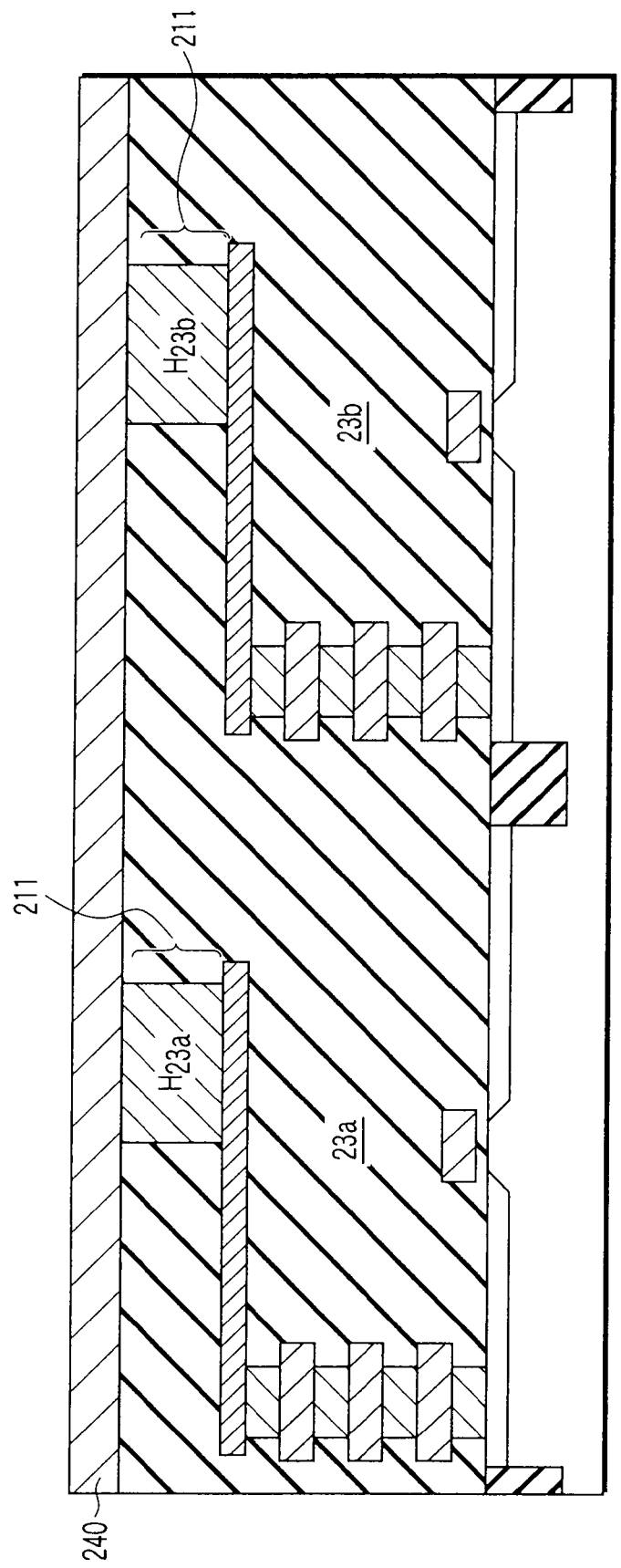
FIG. 17 is a sectional view showing a spin memory of Comparative Example.
Figure 18:
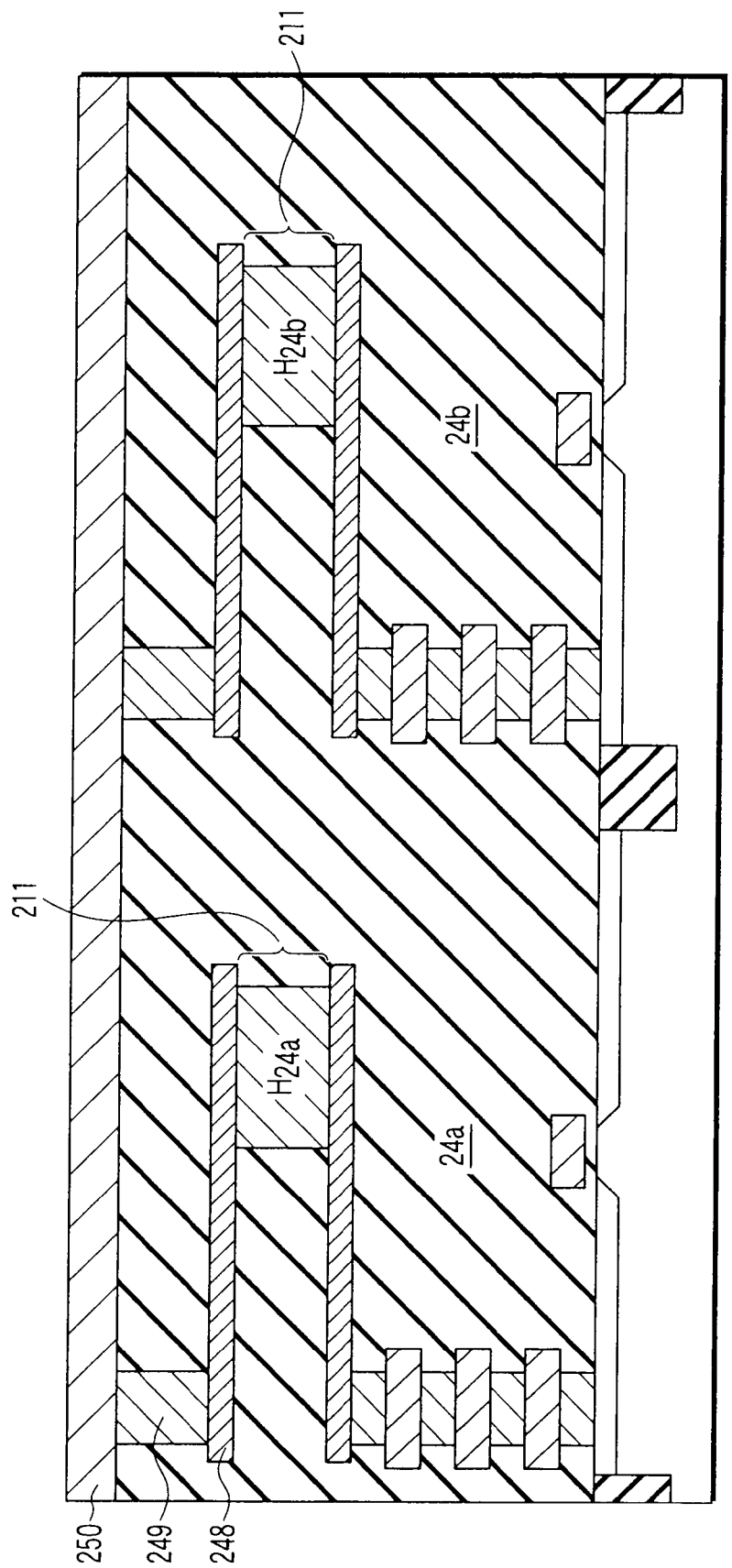
FIG. 18 is a sectional view showing a spin memory of the first applied example.

Specifically, it was investigated how the magnetic field generated at the time of writing differs depending on a case in which an upper electrode 240 is a bit line, as shown in FIG. 17, and a case in which an upper electrode 248 is a local conductive line that is different from the bit line, as shown in FIG. 18.

In the configuration shown in FIG. 17, a 3.7 mA write current was supplied to a memory cell 23b. In this case, when calculation was carried out with respect to a magnetic field $H_{23a}$ applied to the magneto-resistance element 211 of a memory cell 23a and a magnetic field $H_{23b}$ applied to the magneto-resistance element 211 of the memory cell 23b, both of $H_{23a}$ and $H_{23b}$ were equally 10 Oe.

This implies that a magnetic field is applied to the non-selected memory cell 23a other than the selected memory cell 23b at the time of writing.

In general, if a magnetic field is applied to the magneto-resistance element 211, data holding capability is lowered. Thus, it is not desirable that a magnetic field should be applied to such non-selected memory cell 23a.

Therefore, investigation was carried out with respect to the structure shown in FIG. 18, i.e., a structure in which the magneto-resistance element 211 is connected to a bit line 250 via a local conductive line 248.

In this case, the bit line 250 and the magneto-resistance element 211 are spatially distant from each other. Thus, even if a current is supplied to the bit line 250, almost no magnetic field is applied to the magneto-resistance element 211 of a non-selected memory cell 24a.

In the configuration shown in FIG. 18, a 3.7 mA write current was actually supplied to a memory cell 24b. In this case, when calculation was carried out with respect to a magnetic field $H_{24a}$ applied to the memory cell 24a and a magnetic field $H_{24b}$ applied to a memory cell 24b, $H_{24a}$ was 1.0 Oe, whereas $H_{24b}$ was 15 Oe.

Namely, it has been found that, by employing the structure of FIG. 18, a magnetic field can be effectively applied only to the selected memory cell 24b, whereas almost no magnetic field is applied to the non-selected memory cell 24a.

From the results obtained above, as shown in FIG. 18, by employing a structure in which the bit line 250 is spatially distant from the magneto-resistance element 211, a magnetic field applied to a non-selected memory cell can be decreased, and a probability of losing data for the non-selected memory cell can be reduced.

(2) Second Applied Example

A spin FET was manufactured as a second applied example of the present invention.

Procedures for manufacturing this spin FET (sample) are as follows.

First, as shown in FIG. 19, using an ordinary CMOS process, an element isolation insulation area 312 and a channel area 335 are formed on a silicon substrate 311. Next, a silicon oxide film serving as a gate insulation film 317 is grown by means of a thermal oxidization technique, and then, a polysilicon film serving as a gate electrode 318 is deposited on the gate insulation film 317.

In addition, impurities are implanted into the poly-silicon film, annealing is carried out, and then, the gate electrode 318 is patterned using photolithography and RIE.

Then, a side wall insulation layer 319 consisting of $SiO_2$ is formed using a self-alignment process. Then, by using the gate electrode 318 and the side wall insulation layer 319 as masks, the silicon substrate 311 is etched by means of RIE, and then, recessed portions are formed on the silicon substrate 311 at each end of the gate electrode 318.

Next, as shown FIG. 20, $SiO_2$ serving as tunnel barrier layers 331, 332 is formed in each of these recessed portions, and then, (Co50Fe50)80B20 (3 nm)/Ta (5 nm) serving as ferromagnetic metal layers 313, 314 is deposited.

Further, after an area other than the ferromagnetic metal layer 313 is coated with a resist, Ta of the ferromagnetic metal layer 313 is removed. Instead, PtMn (20 nm) serving as an anti-ferromagnetic metal layer 333 and Al serving as metal electrodes 320, 322 are deposited.

Then, PtMn and Al that exist at portions other than required portions are removed.

Note that, wafer transportation between a chamber for executing a process for removing Ta and a chamber for executing a process for depositing PtMn can be carried out in the same transport chamber, thus enabling movement of samples in a vacuum state.

In addition, it is desirable that the ferromagnetic metal layer 313 and the anti-ferromagnetic metal layer 333 should be manufactured using a sputtering device having good directivity.

Then, the similar procedures are executed for the ferromagnetic metal layer 314 side, and then, Cu serving as a nonmagnetic metal layer 315, $Co_{90}Fe_{10}$ serving as a ferromagnetic metal layer 316, and PtMn (20 nm)/Ta (5 nm) serving as an anti-ferromagnetic metal layer 334 are deposited.

Then, after patterning of each layer has been carried out, an inter-layered insulation film and a contact hole are formed, and Al serving as an electrode 321 is formed. Lastly, 1-hour annealing is carried out at 270° C. in a uniform magnetic field of 1 Tesla.

A current value required for writing into the ferromagnetic metal layer 314 was measured with respect to the spin FET of this applied example manufactured in accordance with the procedures described above.

The measurement procedures are as follows.

First, in a path indicated by P1 of FIG. 21, when a spin injection current was supplied to the ferromagnetic metal layer 314, and then, writing was carried out, the critical current density required for writing was 5.0 mA. In addition, in a path indicated by P2 of FIG. 22, when a spin injection current was supplied to the ferromagnetic metal layer 314, and then, writing was carried out, the critical current density required for writing was 4.6 mA.

From the results obtained above, it has been found that the spin FET of this applied example is effective for reduction of a write current required for writing (magnetization inversion).

Next, simulation was carried out with respect to a magnetic field generated when an integrated circuit was configured using the spin FET of FIG. 20.

Figure 23:
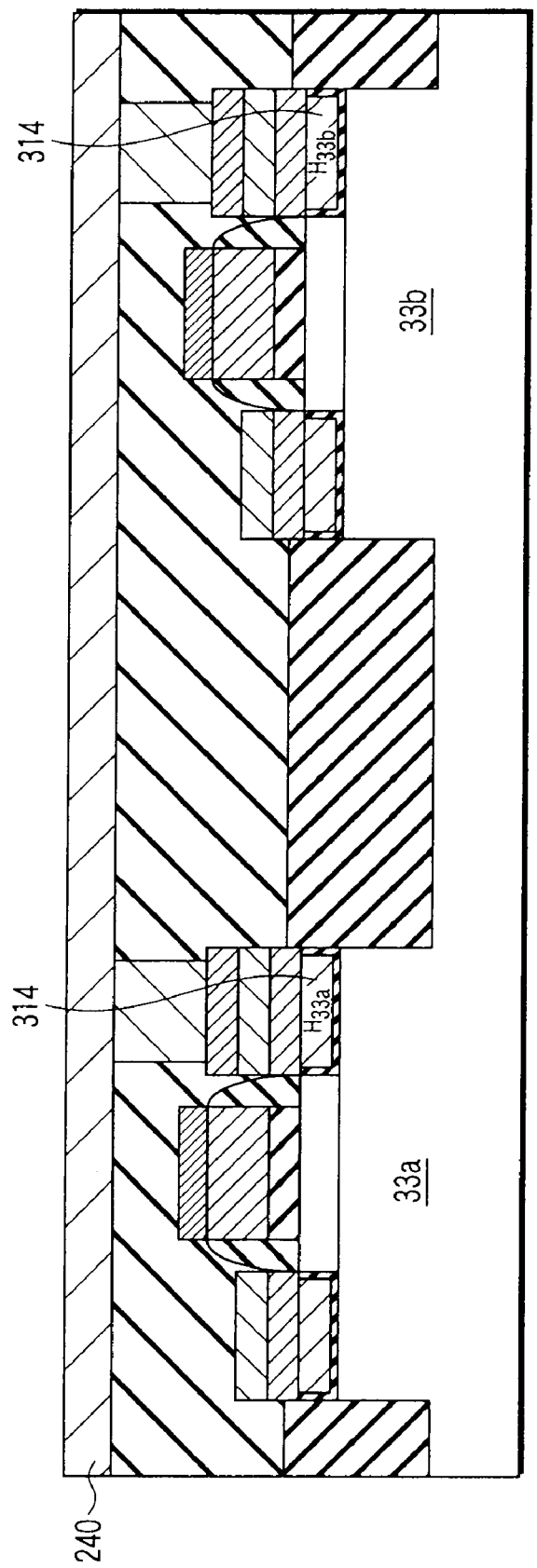
FIG. 23 is a sectional view showing a spin FET of Comparative Example.
Figure 24:
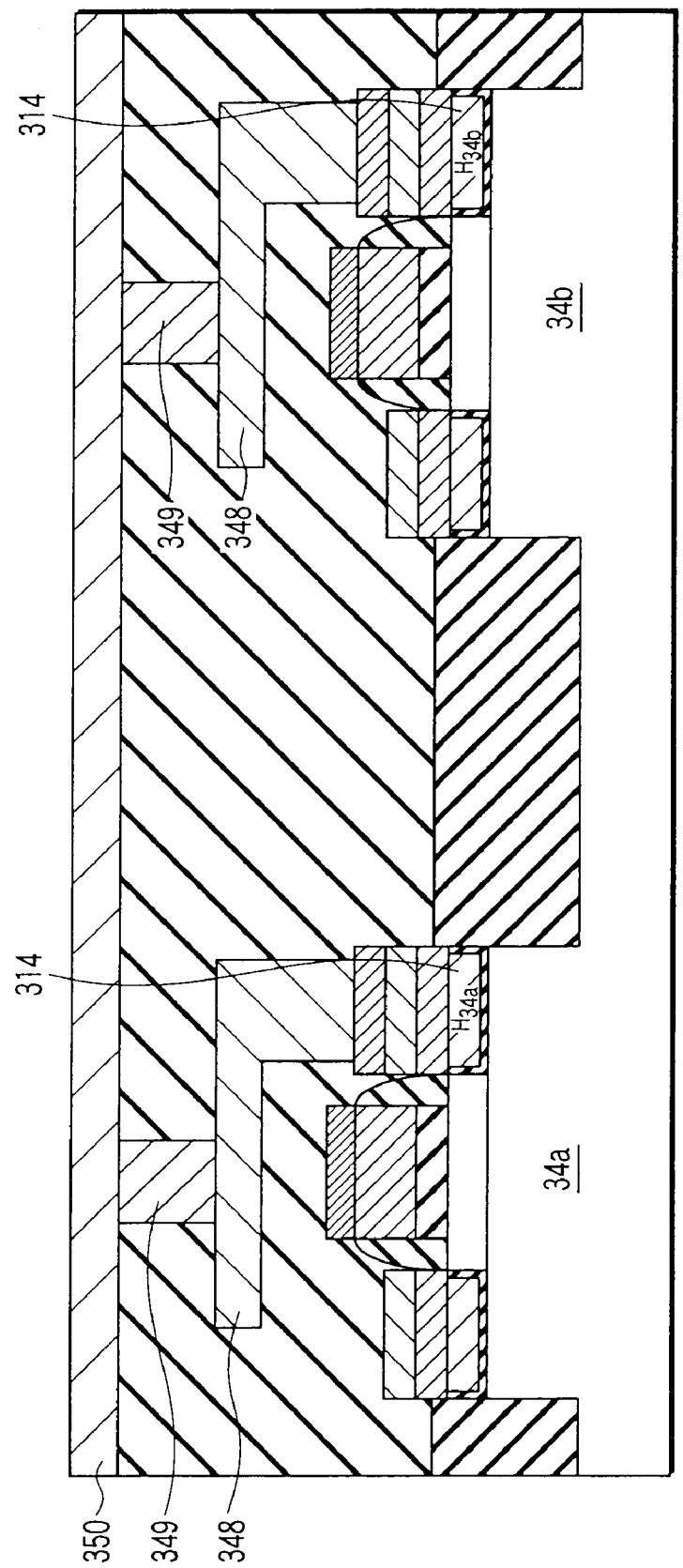
FIG. 24 is a sectional view showing the spin FET of the second applied example.

Specifically, it was investigated how a magnetic field generated at the time of writing differs depending on a case in which an upper electrode 240 is a bit line, as shown in FIG. 23, and a case in which an upper electrode 348 is a local conductive line that is different from the bit line, as shown in FIG. 24.

In a configuration shown in FIG. 23, a 4.6 mA write current was supplied to a spin FET 33b. In this case, when calculation was carried out with respect to a magnetic field H33a applied to the ferromagnetic metal layer 314 of a spin FET 33a and a magnetic field H33b applied to the ferromagnetic metal layer 314 of the spin FET 33b, both of H33a and H33b were equally 15 Oe.

This implies that, at the time of writing, a magnetic field is applied to the non-selected spin FET 33a other than the selected spin FET 33b.

In general, if a magnetic field is applied to the ferromagnetic metal layer 314, data holding capability is lowered. Thus, it is not desirable that a magnetic field should be applied to the non-selected spin FET 33a.

Therefore, investigation was carried out with respect to a structure shown in FIG. 24, in other words, a structure in which the ferromagnetic metal layer 314 is connected to a bit line 350 via a local conductive line 348.

In this case, the bit line 350 and the ferromagnetic metal layer 314 are spatially distant from each other. Thus, even in the case where a current is supplied to the bit line 350, almost no magnetic field is applied to the ferromagnetic metal layer 314 of the non-selected spin FET 33a.

In the configuration shown in FIG. 24, a 4.5 mA write current was actually supplied to a spin FET 34b. In this case, when calculation was carried out with respect to a magnetic field H34a applied to the ferromagnetic metal layer 314 of a spin FET 34a and a magnetic field H34b applied to the ferromagnetic metal layer 314 of the spin FET 34b, H34a was 1.1 Oe, whereas H34b was 16 Oe. In other words, it has been found that, by employing the structure of FIG. 24, a magnetic field can be effectively applied only to the selected spin FET 34b, whereas almost no magnetic field is applied to the non-selected spin FET 34a.

From the results obtained above, as shown in FIG. 24, by employing a structure in which the bit line 350 is spatially distant from the ferromagnetic metal layer 314 of a spin FET, a magnetic field applied to the ferromagnetic metal layer 314 of a non-selected spin FET can be decreased, and then, a probability of losing the data stored in the non-selected spin FET can be decreased.

3. Others

Examples of the present invention are not limited to the embodiments and applied examples described above. For example, either enhancement type or depression type can be applied as a channel type.

Ion implantation or a heterointerface growth process using modulation doping can be utilized as a method for manufacturing channels.

In addition, an integrated circuit can also be configured using the spin FETs of the embodiments and applied examples described above. A semiconductor memory using, as a memory cell, the spin FETs of the embodiments and applied examples described above may be configured.

For example, the spin FET according to examples of the present invention can configure a DRAM (Dynamic Random Access Memory) in combination with a dielectric capacitor; can configure an FRAM (Ferroelectric Random Access Memory) in combination with a ferroelectric capacitor; and can configure an MRAM (Magnetic Random Access Memory) in combination with a magneto-resistance element.

In addition, the spin FET according to examples of the present invention can be used for EEPROM (Programmable Read Only Memory for electrically carrying out data writing or erasing).

Further, the spin FETs of the embodiments and applied examples described above can also be used as memory cells for storing data in accordance with a magnetization direction of a ferromagnetic metal layer serving as a magnetic free layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spin FET comprising:
a first ferromagnetic layer having an invariable magnetization;
a second ferromagnetic layer having a variable magnetization;
a channel between the first and second ferromagnetic layers;
a gate electrode formed on the channel via a gate insulation layer;
a first conductive line which extends in a direction toward an upper portion of the gate electrode from a center of one of the first and second ferromagnetic layers and in a direction between 45 degrees and 90 degrees relative to an axis of hard magnetization of the second ferromagnetic layer, and whose one end in a longitudinal direction is connected to one of the first and second ferromagnetic layers; and
a second conductive line connected to another end in a longitudinal direction of the first conductive line,
wherein writing is executed by supplying spin-polarized electrons to the second ferromagnetic layer and applying a magnetic field from the first conductive line to the second ferromagnetic layer.

2. The spin FET according to claim 1, further comprising an anti-ferromagnetic layer provided for pinning magnetization of the first ferromagnetic layer.

3. The spin FET according to claim 1, further comprising a tunnel barrier layer provided at least one of between the first ferromagnetic layer and the channel and between the second ferromagnetic layer and the channel.

4. The spin FET according to claim 1, wherein at least one of the first and second ferromagnetic layers has a SAF structure.

5. The spin FET according to claim 1, wherein an angle formed between an axis of easy magnetization of the first ferromagnetic layer and an axis of easy magnetization of the second ferromagnetic layer is 0 degree or more and 45 degrees or less.

6. A spin FET comprising:
a first ferromagnetic layer having an invariable magnetization;
a second ferromagnetic layer having a variable magnetization;
a channel between the first and second ferromagnetic layers;
a gate electrode formed on the channel via a gate insulation layer;
a first conductive line which extends in a direction between 45 degrees and 90 degrees relative to an axis of hard magnetization of the second ferromagnetic layer, and whose one end in a longitudinal direction is connected to one of the first and second ferromagnetic layers;
a second conductive line connected to another end in a longitudinal direction of the first conductive line; and
a yoke on the first conductive line,
wherein writing is executed by supplying spin-polarized electrons to the second ferromagnetic layer and applying a magnetic field from the first conductive line to the second ferromagnetic layer.

7. The spin FET according to claim 6, further comprising an anti-ferromagnetic layer provided for pinning magnetization of the first ferromagnetic layer.

8. The spin FET according to claim 6, further comprising a tunnel barrier layer provided at least one of between the first ferromagnetic layer and the channel and between the second ferromagnetic layer and the channel.

9. The spin FET according to claim 6, wherein at least one of the first and second ferromagnetic layers has a SAF structure.

10. The spin FET according to claim 6, wherein an angle formed between an axis of easy magnetization of the first ferromagnetic layer and an axis of easy magnetization of the second ferromagnetic layer is 0 degree or more and 45 degrees or less.

* * * * *